(12) United States Patent
Chang et al.

(10) Patent No.: US 12,272,406 B2
(45) Date of Patent: Apr. 8, 2025

(54) PAGE BUFFER CIRCUITS IN MEMORY DEVICES

(71) Applicant: Macronix International Co., Ltd., Hsinchu (TW)

(72) Inventors: E-Yuan Chang, Chiayi (TW); Ji-Yu Hung, Toufen (TW)

(73) Assignee: Macronix International Co., Ltd., Hsinchu (TW)

( * ) Notice: Subject to any disclaimer, the term of this patent is extended or adjusted under 35 U.S.C. 154(b) by 174 days.

(21) Appl. No.: 18/150,594

(22) Filed: Jan. 5, 2023

(65) Prior Publication Data

US 2024/0233832 A1 Jul. 11, 2024

(51) Int. Cl.
  *G11C 16/00* (2006.01)
  *G11C 16/24* (2006.01)

(52) U.S. Cl.
  CPC ............................ *G11C 16/24* (2013.01)

(58) Field of Classification Search
  CPC ......... G11C 16/26; G11C 16/10; G11C 16/32; G11C 16/0483; G11C 16/08; G11C 11/5642; G11C 2207/2209; G11C 7/22; G11C 8/12; G11C 16/06; G11C 11/5628; G11C 16/30; G11C 7/222; G11C 2211/5641; G11C 7/1048; G11C 13/0004; G11C 13/0038; G11C 13/004; G11C 11/4076; G11C 11/56; G11C 2207/2272; G11C 7/1072; G11C 8/18; G11C 16/3459; G11C 29/42; G11C 7/1006; G11C 2029/0411; G11C 16/20; G11C 16/3454; G11C 2207/2254; G11C 2216/14; G11C 7/10; G11C 16/04; G11C 16/24; G11C 29/022; G11C 29/028; G11C 29/70; G11C 29/832; G11C 7/109; G11C 7/1066; G11C 7/1093; G11C 2029/4402; G11C 29/023; G11C 5/025; G11C 7/1087; G11C 7/14; G11C 16/16; G11C 29/52; G11C 7/1042; G11C 7/1051; G11C 7/106; G11C 7/1084; G11C 7/12; G11C 8/08; G11C 11/5671; G11C 16/102

See application file for complete search history.

(56) References Cited

U.S. PATENT DOCUMENTS 9,460,793 B1 * 10/2016 Oh .................... G11C 16/08
2022/0045080 A1   2/2022 Cho et al.
2024/0154607 A1 * 5/2024 Cheng ................... H03K 5/05

FOREIGN PATENT DOCUMENTS

TW    I735703 B    8/2021

* cited by examiner

*Primary Examiner* — Thong Q Le
(74) *Attorney, Agent, or Firm* — Fish & Richardson P.C.

(57) ABSTRACT

A memory device includes a memory cell array including memory cells; a page buffer circuit including a plurality of page buffers coupled to the memory cell array, each page buffer including a plurality of latches and an internal data line (IDL) arranged to couple to the plurality of latches; and a cache circuit including a plurality of caches. The IDLs of the plurality of page buffers are configured to be conductively connected together to form a data bus (DBUS) that conductively connects the page buffer circuit to the cache circuit for data transfer.

20 Claims, 23 Drawing Sheets

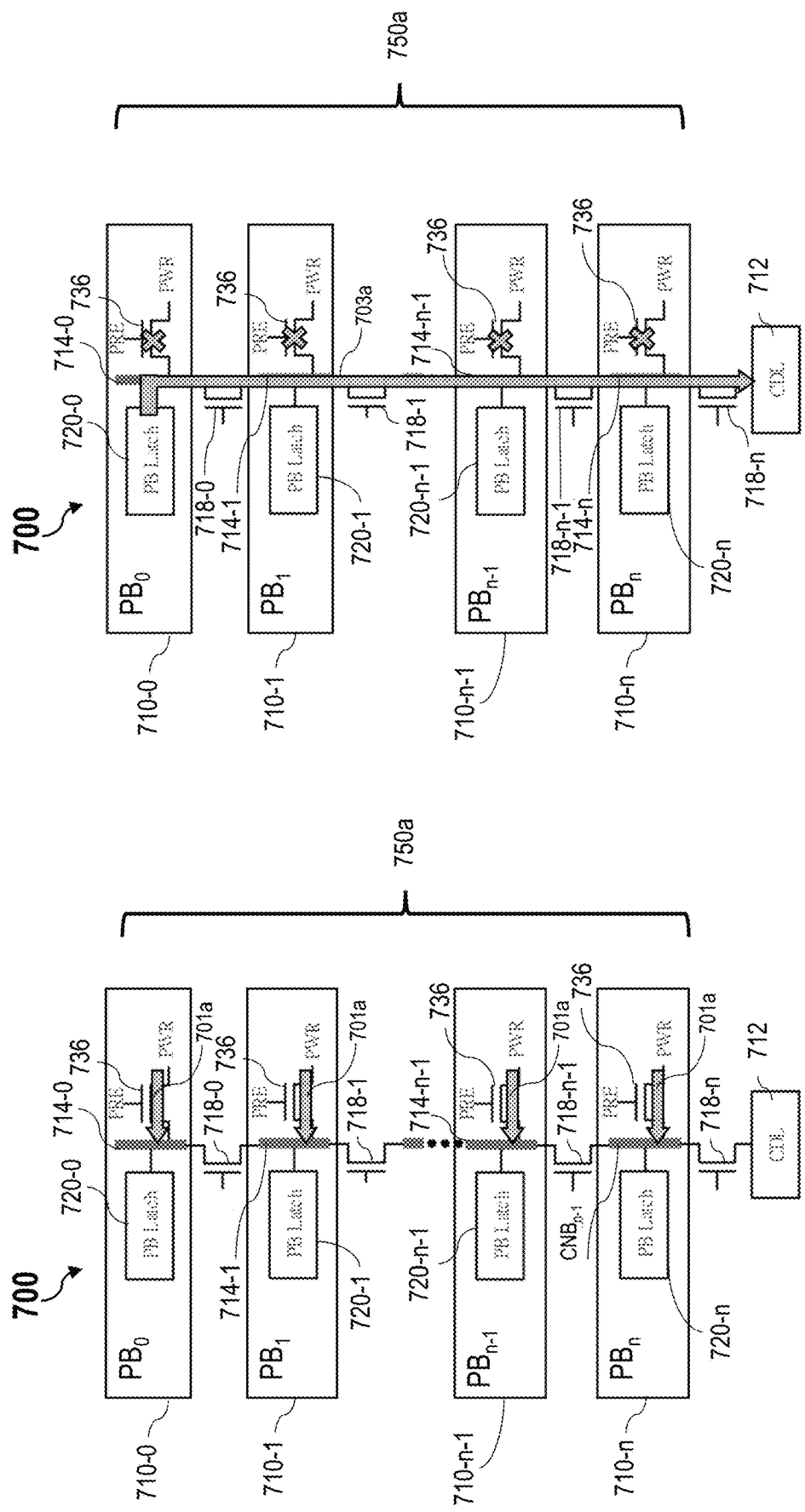

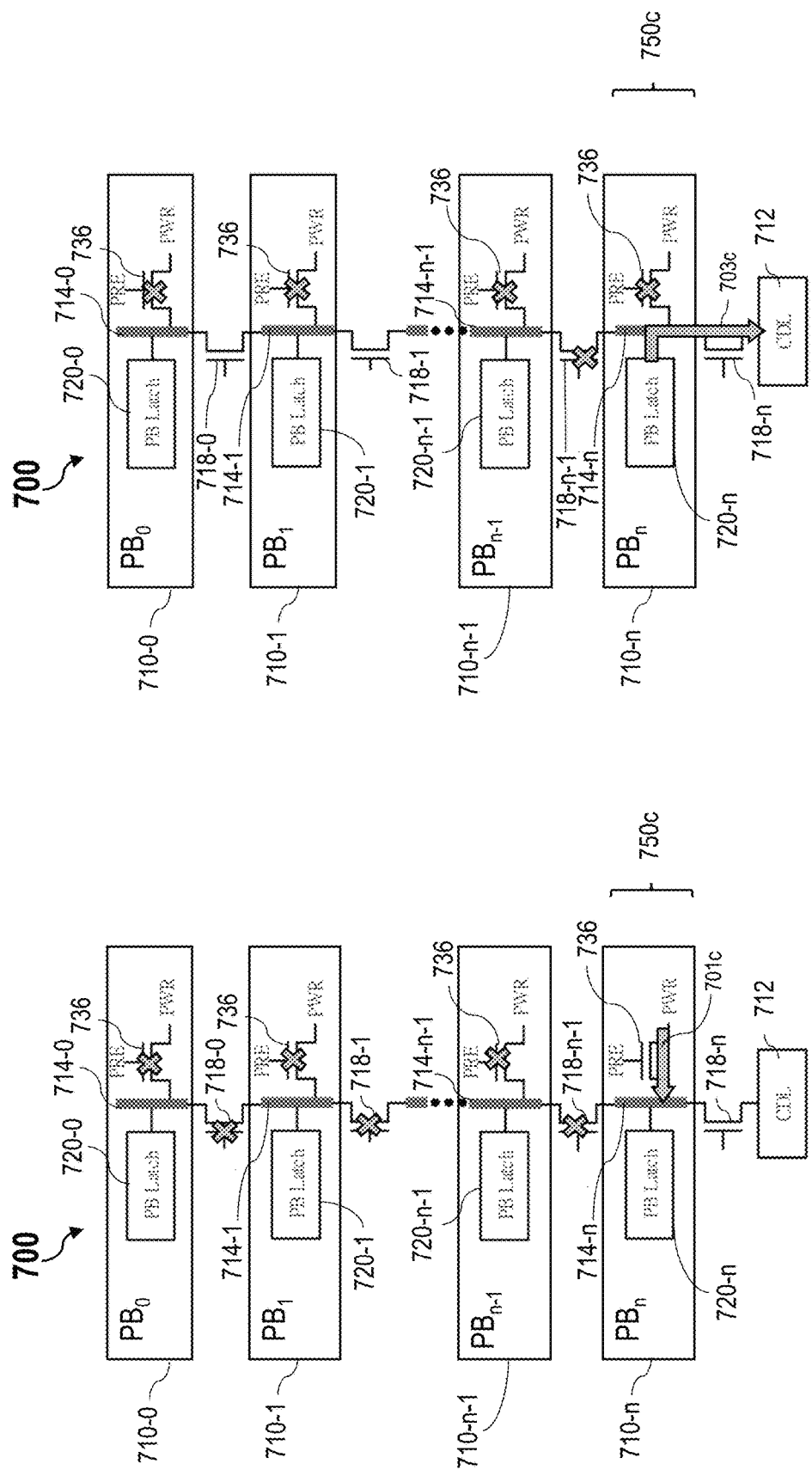

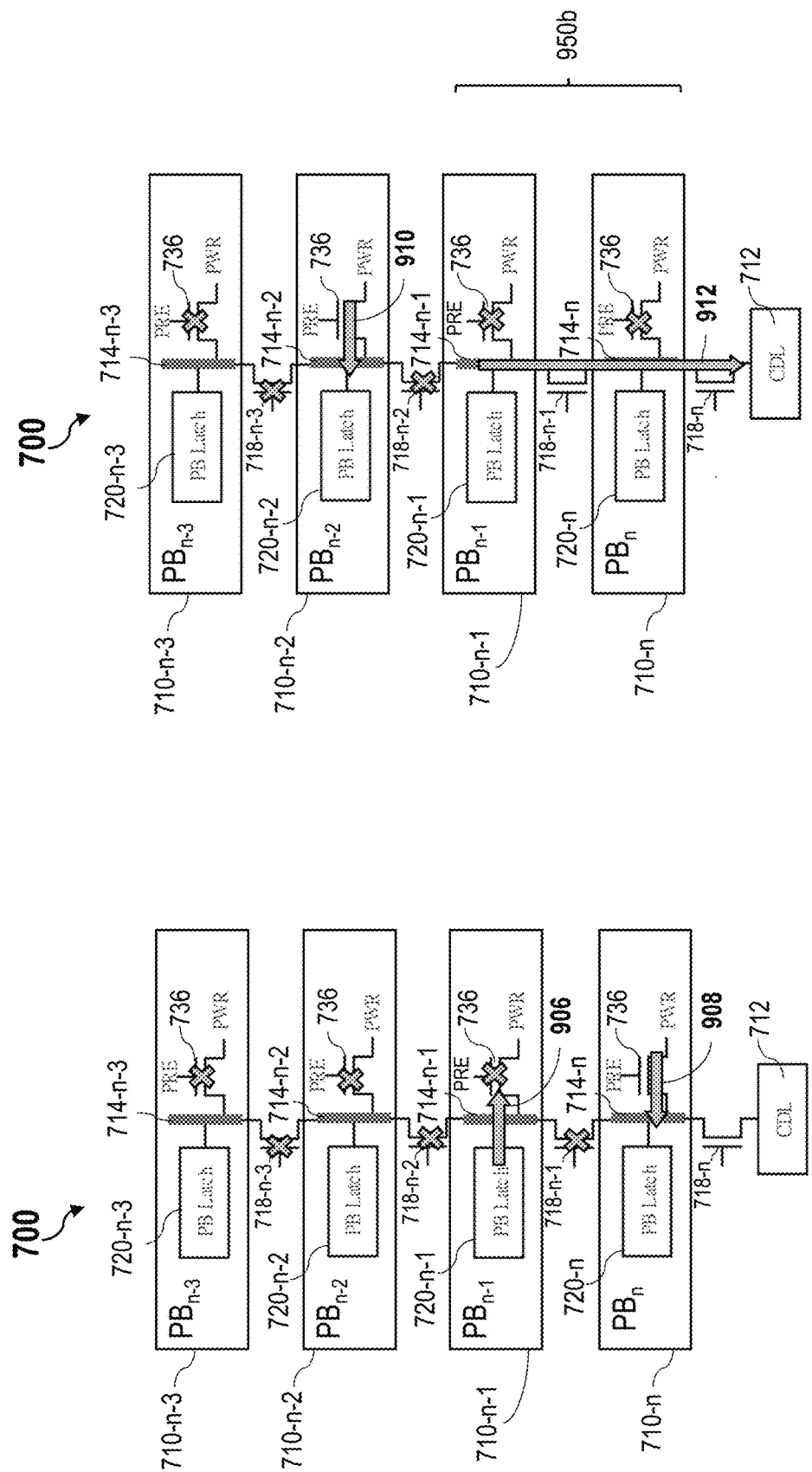

PAGE BUFFER CIRCUITS IN MEMORY DEVICES

BACKGROUND

Integrated circuit memory devices are becoming smaller and faster. One limitation on a size of a memory device arises from the footprint of a data bus that transfers data from page buffers in a page buffer circuit. In addition, memory speed can be limited by parasitic capacitances present during the data transfer.

SUMMARY

The present disclosure describes methods, systems, devices, circuits, and techniques for managing page buffer circuits in memory devices, for example, by providing page buffer circuits in which data bus (DBUS) lines are formed by connecting internal data lines (IDLs) of page buffers.

Some aspects of this disclosure describe memory devices. For example, an example of a memory device includes a memory cell array including memory cells; a page buffer circuit including a plurality of page buffers coupled to the memory cell array, each page buffer including a plurality of latches and an internal data line (IDL) arranged to couple to the plurality of latches; and a cache circuit including a plurality of caches. The IDLs of the plurality of page buffers are configured to be conductively connected together to form a data bus (DBUS) that conductively connects the page buffer circuit to the cache circuit for data transfer.

This and other described memory devices can have one or more of at least the following characteristics.

In some implementations, the memory device includes a plurality of bit lines coupled between the memory cell array and the page buffer circuit. Each page buffer of the plurality of page buffers is conductively connected to a corresponding memory cell in the memory cell array through a corresponding bit line of the plurality of bit lines.

In some implementations, each page buffer of the plurality of page buffers includes a precharge transistor configured to couple the IDL of the page buffer to a supply voltage; a sensing transistor configured to sense a state of a memory cell of the memory cell array; and a strobe transistor configured to couple the sensing transistor to the IDL of the page buffer.

In some implementations, each page buffer of the plurality of page buffers includes, for each latch of the plurality of latches of the page buffer, a corresponding select transistor configured to couple the latch to the IDL of the page buffer, such that the IDL couples the plurality of latches through the corresponding select transistors.

In some implementations, the memory device includes a plurality of connection transistors between adjacent IDLs in the plurality of page buffers. Each connection transistor of the plurality of connection transistors is configured to: be turned on to conductively connect a pair of adjacent IDLs corresponding to the connection transistor, and be turned off to conductively separate the pair of adjacent IDLs corresponding to the connection transistor.

In some implementations, each connection transistor of the plurality of connection transistors includes: a first terminal conductively connected to a first IDL of the pair of adjacent IDLs corresponding to the connection transistor; a second terminal conductively connected to a second IDL of the pair of adjacent IDLs corresponding to the connection transistor; and a gate terminal configured to receive a control signal for turning on or off the connection transistor.

In some implementations, the memory device includes a control circuitry configured to: turn off at least one of the plurality of connection transistors to conductively separate a first IDL of a first page buffer of the plurality of page buffers from other IDLs of other page buffers of the plurality of page buffers; and while the first IDL is conductively separated from the other IDLs, control at least one transistor in the first page buffer to sense data from the memory cell array and to transfer the sensed data through the first IDL to a latch of the first page buffer for storing the sensed data.

In some implementations, turning off the at least one of the plurality of connection transistors includes turning off all of the plurality of connection transistors, to conductively separate each IDL of the plurality of page buffers from each other IDL of the plurality of page buffers. The control circuitry is configured to, while each IDL of the plurality of page buffers is conductively separated from each other IDL of the plurality of page buffers, control at least one transistor in each page buffer of the plurality of page buffers to perform a read operation with each of the plurality of page buffers simultaneously.

In some implementations, the control circuitry is configured to: conductively connect the first IDL to a supply voltage to precharge the first IDL; after the first IDL is precharged to a precharged voltage, conductively connect the first IDL to a sensing transistor that is turned on, such that the first IDL discharges through the sensing transistor if a state of a memory cell of the memory cell array corresponds to bit "0", or the first IDL remains at the precharged voltage if the state of the memory cell of the memory cell array corresponds to bit "1"; and conductively connect the latch of the first page buffer to the first IDL, so that the latch stores data corresponding to a voltage level of the first IDL.

In some implementations, the memory device includes a control circuitry configured to: turn off at least one of the plurality of connection transistors to conductively separate a first IDL of a first page buffer of the plurality of page buffers from other IDLs of other page buffers of the plurality of page buffers; and while the IDL is conductively separate from the other IDLs, control at least one transistor in the first page buffer to cause data stored in a first latch of the first page buffer to be transferred through the first IDL to a second latch of the first page buffer.

In some implementations, the control circuitry is configured to: conductively connect the first IDL to a supply voltage to precharge the first IDL; and conductively connect the first latch and the second latch to the first IDL to transfer the data stored in the first latch to the second latch.

In some implementations, the memory device includes a control circuitry configured to: turn on at least one of the plurality of connection transistors to form a first DBUS coupled to the cache circuit, the first DBUS including a first IDL of a first page buffer of the plurality of page buffers; and control at least one transistor in the first page buffer to cause data stored in a latch of the first page buffer to be transferred through the first DBUS to the cache circuit.

In some implementations, the control circuitry is configured to, while forming the first DBUS, turn off a second connection transistor of the plurality of connection transistors to conductively separate the first IDL from a second IDL that is adjacent to the first IDL.

In some implementations, the first DBUS includes the first IDL and at least one other IDL of at least one other page buffer of the plurality of page buffers, the at least one other IDL being arranged conductively between the first IDL and the cache circuit. The data stored in the latch of the first page buffer is transferred through the first IDL and through the at least one other IDL to the cache circuit.

In some implementations, the control circuitry is configured to: turn on a precharge transistor of the first page buffer to conductively connect the first DBUS to a supply voltage for precharging the first DBUS; turn off the precharge transistor; and subsequent to turning off the precharge transistor, turn on a select transistor of the first page buffer to conductively connect the latch to the first IDL.

In some implementations, the memory device includes a control circuitry configured to sequentially transfer data from each page buffer to the cache circuit. The sequential transfer for each page buffer includes: controlling the plurality of connection transistors to form a corresponding DBUS such that the corresponding DBUS begins with the IDL of the page buffer and extends to conductively connect the page buffer to the cache circuit; and controlling one or more transistors of the page buffer to transfer data from a latch of the page buffer to the cache circuit through the corresponding DBUS.

In some implementations, the memory device includes a control circuitry configured to, during a first phase of operation: control the plurality of connection transistors to apportion the IDLs of the plurality of page buffers into one or more first IDLs forming a first group, corresponding to one or more first page buffers, that are conductively connected to one another, and one or more second IDLs forming a second group, corresponding to one or more second page buffers, that are conductively connected to one another and conductively separate from the one or more first IDLs of the second group; conductively connect the one or more first IDLs to a supply voltage to precharge the one or more first IDLs; and control one or more transistors of the one or more second page buffers to transfer data from a latch of the one or more second page buffers to the one or more second IDLs.

In some implementations, the one or more second IDLs are conductively connected to the cache circuit, such that the one or more second IDLs form a first DBUS, the first DBUS coupling the one or more second page buffers to the cache circuit. During the first phase of operation, the data from the latch of the one or more second page buffers is transferred to the cache circuit through the first DBUS.

In some implementations, the control circuitry is configured to, during a second phase of operation subsequent to the first phase of operation: control one or more transistors of the one or more first page buffers to transfer data from a latch of the one or more first page buffers to the one or more first IDLs; and conductively connect the one or more second IDLs to the supply voltage to precharge the one or more second IDLs.

In some implementations, the control circuitry is configured to, during a third phase of operation subsequent to the second phase of operation: control the plurality of connection transistors to conductively connect the one or more first IDLs to the one or more second IDLs, such that the data from the latch of the one or more first page buffers is transferred from the one or more first IDLs to the one or more second IDLs and the cache circuit.

In some implementations, the control circuitry is configured to: control the plurality of connection transistors to apportion the IDLs of the plurality of page buffers into one or more third IDLs forming a third group, corresponding to one or more third page buffers, that are conductively connected to one another. The one or more third IDLs are adjacent to the one or more first IDLs. The control circuitry is further configured to, during a fourth phase of operation subsequent to the third phase of operation: conductively connect the one or more first IDLs to the supply voltage to precharge the one or more first IDLs; and control one or more transistors of the one or more third page buffers to transfer data from a latch of the one or more third page buffers to the one or more third IDLs.

In some implementations, the control circuitry is configured to, during a fifth phase of operation subsequent to the fourth phase of operation: control the plurality of connection transistors to conductively connect the one or more first IDLs to the one or more third IDLs, such that the data from the latch of the one or more third page buffers is transferred from the one or more third IDLs to the one or more first IDLs; and conductively connect the one or more second IDLs to the supply voltage to precharge the one or more second IDLs.

In some implementations, the control circuitry is configured to, during a sixth phase of operation subsequent to the fifth phase of operation: control the plurality of connection transistors to conductively connect the one or more second IDLs to the one or more first IDLs, such that the data from the latch of the one or more third page buffers is transferred from the one or more first IDLs to the one or more second IDLs and the cache circuit.

In some implementations, the IDLs of the plurality of page buffers are arranged in a single metal channel of the memory device.

In some implementations, the memory device includes a connection transistor between the cache circuit and a first IDL of the IDLs of the plurality of page buffers. The connection transistor is configured to: be turned on to conductively connect the first IDL to the cache circuit, and be turned off to conductively separate the first IDL from the cache circuit.

Some aspects of this disclosure describe page buffer circuits. For example, an example of a page buffer circuit includes a plurality of page buffers, each page buffer including a plurality of latches and an internal data line (IDL) arranged to couple to the plurality of latches. The IDLs of the plurality of page buffers are configured to be conductively connected together to form a data bus (DBUS) for data transfer.

This and other described page buffer circuits can have one or more of at least the following characteristics.

In some implementations, the page buffer circuit includes a plurality of connection transistors between adjacent IDLs in the plurality of page buffers. Each connection transistor of the plurality of connection transistors is configured to: be turned on to conductively connect a pair of adjacent IDLs corresponding to the connection transistor, and be turned off to conductively separate the pair of adjacent IDLs corresponding to the connection transistor.

In some implementations, the IDLs of the plurality of page buffers are arranged in series with one another in a single metal channel of the memory device.

In some implementations, each page buffer of the plurality of page buffers includes: a precharge transistor configured to couple the IDL of the page buffer to a supply voltage; a sensing transistor configured to sense a state of a memory cell of the memory cell array; and a strobe transistor configured to conductively connect the sensing transistor to the IDL of the page buffer.

In some implementations, the page buffer circuit can be controlled to perform one or more data transfer and/or data readout operations, e.g., as described in relation to the above-noted example of a memory device and as described throughout this disclosure.

Some aspects of this disclosure describe methods. For example, the methods include any of the control operations described above with respect to the example of the memory device. An example of a method includes controlling a plurality of connection transistors of a page buffer circuit, the page buffer circuit including: a plurality of page buffers coupled to a memory cell array, each page buffer including a plurality of latches and an internal data line (IDL) arranged to couple to the plurality of latches, and the plurality of connection transistors between adjacent IDLs in the plurality of page buffers. Each connection transistor of the plurality of connection transistors is configured to be turned on to conductively connect a pair of adjacent IDLs corresponding to the connection transistor, and be turned off to conductively separate the pair of adjacent IDLs corresponding to the connection transistor.

This and other described methods can have one or more of at least the following characteristics.

In some implementations, controlling the plurality of connection transistors includes turning off at least one of the plurality of connection transistors to conductively separate a first IDL of a first page buffer of the plurality of page buffers from other IDLs of other page buffers of the plurality of page buffers. The method further includes, while the first IDL is conductively separated from the other IDLs, controlling at least one transistor in the first page buffer to sense data from the memory cell array and to transfer the sensed data through the first IDL to a latch of the first page buffer for storing the sensed data.

In some implementations, turning off the at least one of the plurality of connection transistors includes turning off all of the plurality of connection transistors, to conductively separate each IDL of the plurality of page buffers from each other IDL of the plurality of page buffers. The method includes, while each IDL of the plurality of page buffers is conductively separated from each other IDL of the plurality of page buffers, controlling at least one transistor in each page buffer of the plurality of page buffers to perform a read operation with each of the plurality of page buffers simultaneously.

In some implementations, the method includes conductively connecting the first IDL to a supply voltage to precharge the first IDL; after the first IDL is precharged to a precharged voltage, conductively connecting the first IDL to a sensing transistor that is turned on, such that the first IDL discharges through the sensing transistor if a state of a memory cell of the memory cell array corresponds to bit "0", or the first IDL remains at the precharged voltage if the state of the memory cell of the memory cell array corresponds to bit "1"; and conductively connecting the latch of the first page buffer to the first IDL, so that the latch stores data corresponding to a voltage level of the first IDL.

In some implementations, controlling the plurality of connection transistors includes turning off at least one of the plurality of connection transistors to conductively separate a first IDL of a first page buffer of the plurality of page buffers from other IDLs of other page buffers of the plurality of page buffers. The method includes, while the IDL is conductively separate from the other IDLs, controlling at least one transistor in the first page buffer to cause data stored in a first latch of the first page buffer to be transferred through the first IDL to a second latch of the first page buffer.

In some implementations, the method includes conductively connecting the first IDL to a supply voltage to precharge the first IDL; and conductively connecting the first latch and the second latch to the first IDL to transfer the data stored in the first latch to the second latch.

In some implementations, controlling the plurality of connection transistors includes: turning on at least one of the plurality of connection transistors to form a first data bus (DBUS) coupled to a cache circuit, the first DBUS including a first IDL of a first page buffer of the plurality of page buffers; and controlling at least one transistor in the first page buffer to cause data stored in a latch of the first page buffer to be transferred through the first DBUS to the cache circuit.

In some implementations, the method includes, while forming the first DBUS, turning off a second connection transistor of the plurality of connection transistors to conductively separate the first IDL from a second IDL that is adjacent to the first IDL.

In some implementations, the first DBUS includes the first IDL and at least one other IDL of at least one other page buffer of the plurality of page buffers, the at least one other IDL being arranged conductively between the first IDL and the cache circuit. The data stored in the latch of the first page buffer is transferred through the first IDL and through the at least one other IDL to the cache circuit.

In some implementations, the method includes: turning on a precharge transistor of the first page buffer to conductively connect the first DBUS to a supply voltage for precharging the first DBUS; turning off the precharge transistor; and subsequent to turning off the precharge transistor, turning on a select transistor of the first page buffer to conductively connect the latch to the first IDL.

In some implementations, controlling the plurality of connection transistors includes sequentially transferring data from each page buffer to a cache circuit, including, for each page buffer: controlling the plurality of connection transistors to form a corresponding data bus (DBUS) such that the corresponding DBUS begins with the IDL of the page buffer and extends to conductively connect the page buffer to the cache circuit; and controlling one or more transistors of the page buffer to transfer data from a latch of the page buffer to the cache circuit through the corresponding DBUS.

In some implementations, controlling the plurality of connection transistors includes, during a first phase of operation: controlling the plurality of connection transistors to apportion the IDLs of the plurality of page buffers into one or more first IDLs, corresponding to one or more first page buffers, that are conductively connected to one another, and one or more second IDLs, corresponding to one or more second page buffers, that are conductively connected to one another and conductively separate from the one or more first IDLs. The method includes: controlling one or more first transistors of the one or more first page buffers to transfer data from a latch of the one or more first page buffers to the one or more first IDLs; and conductively connecting the one or more second IDLs to a supply voltage to precharge the one or more second IDLs.

In some implementations, the one or more first IDLs are conductively connected to a cache circuit, such that the one or more first IDLs form a first DBUS, the first DBUS coupling the one or more first page buffers to the cache circuit. During the first phase of operation, the data from the latch of the one or more first page buffers is transferred to the cache circuit through the first DBUS.

In some implementations, the one or more second IDLs are conductively separated from other IDLs of the plurality of page buffers.

In some implementations, the method includes, during a second phase of operation subsequent to the first phase of operation, controlling the plurality of connection transistors to conductively connect the one or more first IDLs to a third IDL that is adjacent to the one or more first IDLs, such that the data from the latch of the one or more first page buffers is transferred from the one or more first IDLs to the third IDL that is adjacent to the one or more first IDLs.

In some implementations, the third IDL that is adjacent to the one or more first IDLs is included in the one or more second IDLs that are precharged during the first phase of operation.

In some implementations, the one or more first IDLs includes a first plurality of IDLs, and the one or more second IDLs include a second plurality of IDLs. The latch of the one or more first page buffers is a first latch of a first page buffer of the one or more first page buffers. The method includes, during a second phase of operation subsequent to the first phase of operation, controlling the plurality of connection transistors to conductively separate the first plurality of IDLs from other IDLs of the plurality of page buffers, and conductively connecting the first plurality of IDLs to the supply voltage to precharge the first plurality of IDLs. The method includes, during a third phase of operation subsequent to the second phase of operation, controlling one or more second transistors of a second page buffer of the first plurality of page buffers to transfer data from a second latch of the second page buffer to the first plurality of IDLs.

Implementations of the above techniques include methods, systems, circuits, computer program products and computer-readable media. In one example, a method can be performed in a non-volatile memory and the method can include the above-described actions, e.g., the actions for managing page buffer circuits. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

The techniques can be implemented in any type of circuits or devices that store data and that transfer data, such as between multiple data storage units (e.g., page buffers) and/or from multiple data storage units to another unit (e.g., a cache circuit). In some implementations, data transfer processes can be performed more quickly, e.g., by reducing a charging time and/or a transfer time associated with a data line. For example, multiple segments (e.g., internal data lines of page buffers) can be controllably conductively connected/separated from one another to form adjustable-length data buses that can have reduced capacitances compared to fixed, non-configurable data buses. The reduced capacitances can be associated with faster data transfer operations. In some implementations, pipelining based on the configurable data bus can reduced data transfer times, e.g., by performing separate operations (e.g., separate precharging and data transfer operations) on different groups of one or more internal data lines. Also, compared to page buffer circuits that include data buses that are separate from internal data lines of page buffers, the page buffer circuits described herein can have reduced metal routing requirements (e.g., a free metal channel that would otherwise be consumed by a separate data bus), in some implementations allowing for reduced device area (e.g., a size of a page buffer circuit and/or a memory device) and/or improved local metal routing.

The techniques can be implemented with any types of memory transistors (or memory cells), any types of metal-oxide-silicon (MOS) transistors, e.g., n-channel and/or p-channel transistors, any types of bipolar junction transistors (BJTs), and any types of inverters. The techniques can be applied to different types of memory systems, e.g., two-dimensional (2D) memory systems or three-dimensional (3D) memory systems. The techniques can be applied to various memory cell types, such as SLC (single-level cell), or MLC (multi-level cell) like 2-level cell, TLC (triple-level cell), TLC (quad-level cell), or PLC (Penta-level cell). The techniques can be applied to various types of volatile memory devices or non-volatile memory devices, such as Static Random Access Memory (SRAM), Dynamic Random Access Memory (DRAM), flash memory such as NOR flash memory and/or NAND flash memory, resistive random-access memory (RRAM), magnetoresistive random-access memory (MRAM), phase-change random-access memory (PCRAM), among others. Additionally or alternatively, the techniques can be applied to various types of devices and systems, such as secure digital (SD) cards, embedded multimedia cards (eMMC), or solid-state drives (SSDs), embedded systems, among others.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIGS. 7A-7F illustrate sequential data transfer from page buffers of a page buffer circuit to a cache circuit.

FIGS. 9A-9G illustrate pipelined data transfer from page buffers of a page buffer circuit to a cache circuit.

FIG. 9H shows a timing diagram illustrating operations of pipelined data transfer.

Like reference numbers and designations in the various drawings indicate like elements. It is also to be understood that the various exemplary implementations shown in the figures are merely illustrative representations and are not necessarily drawn to scale.

DETAILED DESCRIPTION

Example Systems and Memory Devices

Figure 1A:
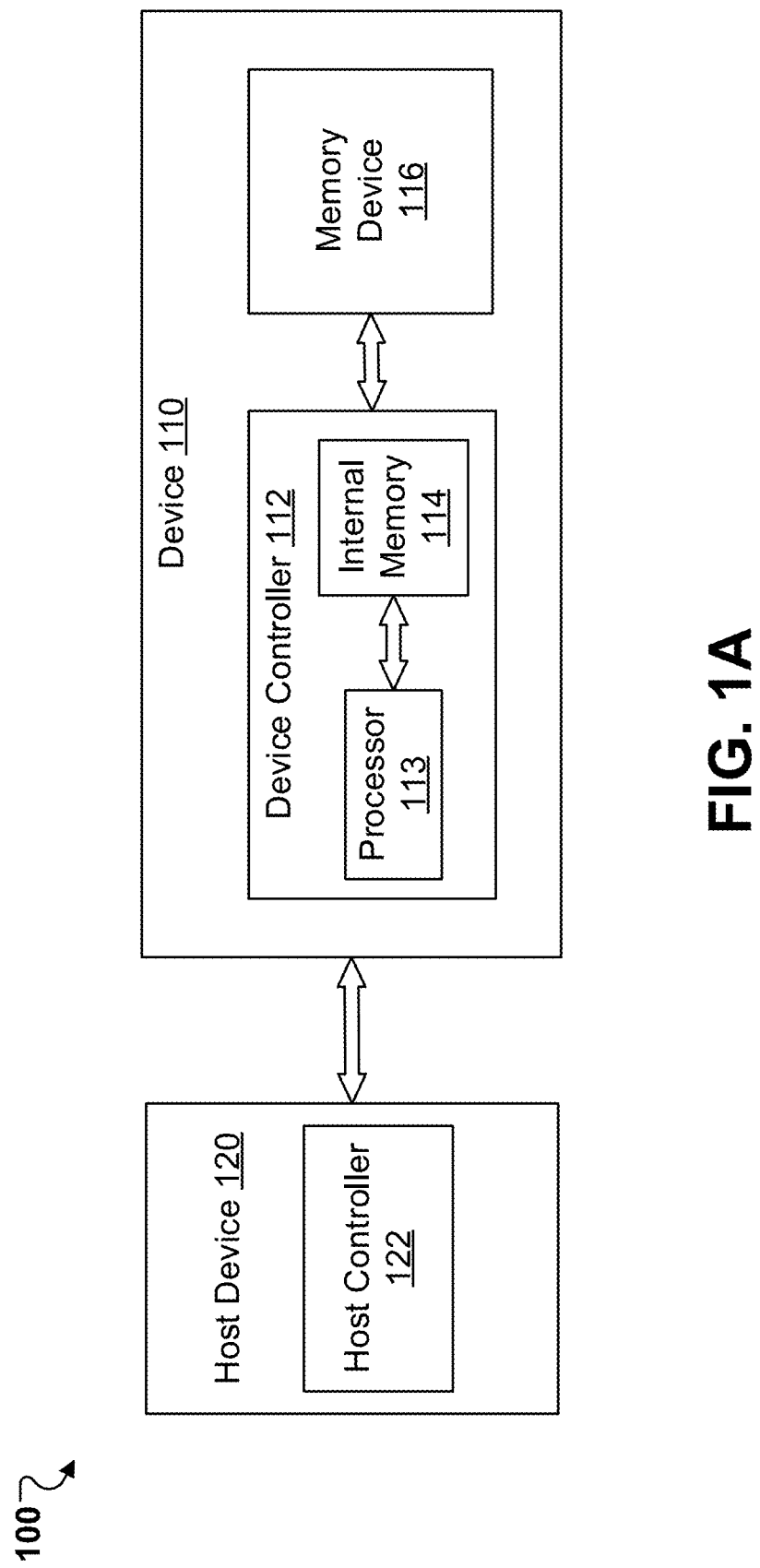
FIG. 1A illustrates an example of a system including a memory device.

FIG. 1A illustrates an example of a system 100. The system 100 includes a device 110 and a host device 120. The device 110 includes a device controller 112 and a memory device 116. The device controller 112 includes a processor 113 and an internal memory 114. In some implementations, the device 110 includes a plurality of memories 116 that are coupled to the device controller 112. The host device 120 includes a host controller 122 that can include at least one processor and at least one memory coupled to the at least one processor and storing programming instructions for execution by the at least one processor to perform one or more corresponding operations.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory 114 is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory device 116 to the internal memory 114. The memory device 116 can be a semiconductor device. In some implementations, the memory device 116 is a non-volatile memory that is configured for long-term storage of instructions and/or data, e.g., a NAND flash memory, or some other suitable non-volatile memory. In implementations where the memory device 116 is NAND flash memory, the device 110 is a flash memory, e.g., a flash memory card, and the device controller 112 is a NAND flash controller. For example, in some implementations, when the device 110 is an eMMC or an SD card, the memory device 116 is a NAND flash; in some implementations, when the device 110 is a digital camera, the memory device 116 is an SD card; and in some implementations, when the device 110 is a media player, the memory device 116 is a hard disk.

In some implementations, the device controller 112 is configured to receive data and instructions from and to send data to the host device 120. The device controller 112 is further configured to send data and commands to the memory device 116 and to receive data from the memory device 116. For example, the device controller 112 is configured to send data and a write command to instruct the memory device 116 to store the data to a specified address. As another example, the device controller 112 is configured to receive a read request (or a read command) from the host device 120 and send a corresponding read command to the memory device 116 to read data from a specified address in the memory device 116.

The memory device 116 includes a plurality of blocks. The memory device 116 can be a two-dimensional (2D) memory including 2D memory blocks, e.g., as described with further details in FIG. 1B. The memory device 116 can also be a three-dimensional (3D) memory including 3D memory blocks, e.g., as described with further details in FIG. 1C. Each block can include a same number of pages. Each page has a unique number in the block. Data is stored in the pages of the block according to the order of the unique numbers of the pages in the block. Each page can be read or written separately, and pages in a block can be erased together.

In some implementations, a block can be divided into a number of sub-blocks. Each sub-block can include one or more pages. Each page in a sub-block can be read or written separately. The one or more pages in each sub-block can be erased together. In some implementations, the memory device 116 includes one or more dies. Each die can be a memory chip and include a number of memory arrays and peripheral circuitry thereon. A memory array can include a number of planes, with each plane including a number of physical blocks of memory cells. Each physical block can include a number of pages of memory cells that can store a number of sectors of data. A super block can be specified, e.g., by a memory controller such as the controller 112 of FIG. 1A, to combine at least one physical block from different planes. Each physical block in the super block comes from a different plane, that is, any plane cannot provide more than one block in the super block. The super block includes a number of super pages each combining multiple pages from the corresponding multiple physical blocks in the super block. Each page in a super page can have a same page number in its corresponding physical block. A super page can be programmed with all the pages in the super page being programmed simultaneously.

A memory cell can represent a number of states including an erased state and one or more programmed states. For example, in some cases, the memory cell is a single-level cell (SLC) that can store 1 bit and represent 2 states including an erased state (ER) and a programmed state (A). Memory cells in one word line can form one page. In some cases, the memory cell is a multi-level cell (MLC) such as a 2-level cell that can store 2 bits and represent 4 states including an erased state (ER) and three programmed states (A, B, and C). Memory cells in one word line can form two pages. In some cases, the memory cell is a triple-level cell (TLC) that can store 3 bits and represent 8 states including an erased state (ER) and seven programmed states (A, B, C, D, E, F, and G). Memory cells in one word line can form three pages. The states can have progressively higher voltage ranges, and the erased state has the lowest voltage rage.

Figure 1B:
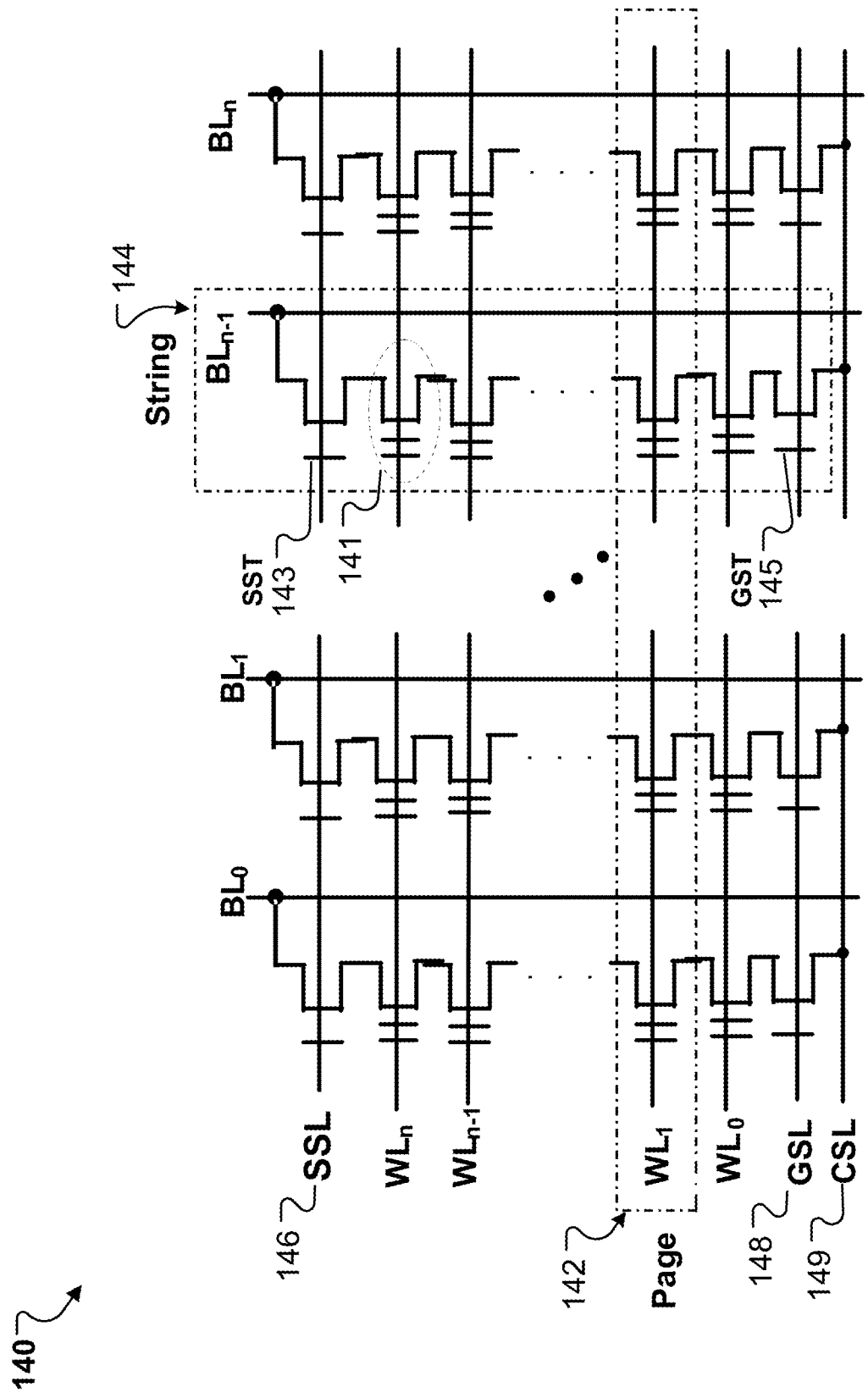
FIG. 1B illustrates an example of a block of a two-dimensional (2D) memory device.

FIG. 1B illustrates an example configuration of a 2D memory block 140 when the memory device 116 is a 2D memory. The block 140 includes memory cells 141 coupled in series to column bit lines $BL_0, BL_1, \ldots, BL_{n-1}$, and $BL_n$ to form a number of cell strings 144, and to row word lines $WL_0, WL_1, \ldots, WL_{n-1}$, and $WL_n$ to form a number of cell pages 142.

Each memory cell in a block includes a transistor structure having a gate, a drain, a source, and a channel defined between the drain and the source. Each memory cell is located at an intersection between a word line and a bit line, where the gate is connected to the word line, the drain is connected to the bit line, and the source is connected to a source line, which in turn is connected to common ground. In some examples, the gate of a flash memory cell has a dual-gate structure, including a control gate and a floating gate, where the floating gate is suspended between two oxide layers to trap electrons that program the cell.

A cell string 144 can include a number of memory cells 141, a string select transistor (SST) 143, and a ground select transistor (GST) 145, which are all connected in series. A gate of the SST 143 is connected to a string select line (SSL) 146. Gates of the SSTs 143 in different strings are also connected to the same SSL. Gates of the memory cells 141 are respectively connected to word lines $WL_0, WL_1, \ldots, WL_{n-1}. WL_n$. The cell strings 144 or the memory cells 141 are connected to a common source line (CSL) 149 via the GST 145. The CSL 149 can be coupled to a ground or a supply voltage. A gate of the GST 145 is connected to a ground select line (GSL) 148. Gates of the GSTs 145 in different strings 144 are also connected to the same GSL 148.

A cell page 142 can include a number of memory cells 141. Gates of the memory cells 141 in the cell page 142 are coupled in series to a respective word line (WL). When an input voltage is applied to the word line, the input voltage is also applied to the gates of the memory cells 141 in the cell page 142. To read a particular cell page 142 in the block 140 in a read operation, a lower read voltage is applied onto a word line corresponding to the particular cell page 142. Meanwhile, a higher read voltage is applied onto the other cell pages in the block 140.

Figure 1C:
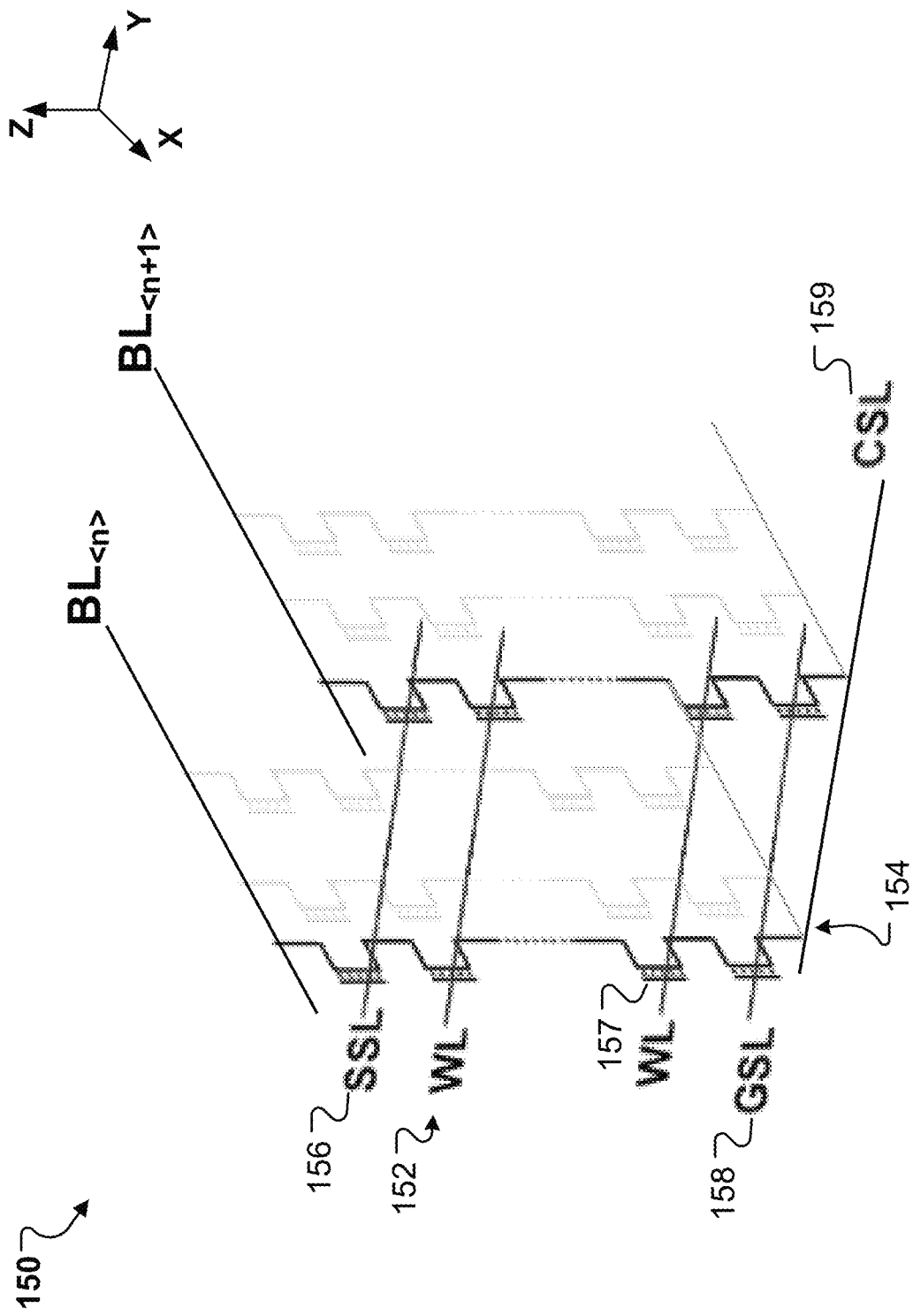
FIG. 1C illustrates an example of a block of a three-dimensional (3D) memory device.

FIG. 1C illustrates an example 3D memory block 150 when the memory device 116 (shown in FIG. 1A) is a 3D memory. The 3D memory block 150 can include a stack of the 2D memory block 140 of FIG. 1B. Memory cells 157 are arranged in three dimensions, e.g., in an XYZ coordinate system, and coupled to a number of word lines to form a number of cell pages (conductive layers or word line layers) 152 and a number of bit lines (e.g., $BL_{<n>}, BL_{<n+1>}$) to form a number of cell strings 154. A cell page 152 can be a layer, e.g., in the XY plane, and memory cells 157 on the same layer can be coupled to one word line and have a same voltage. Each cell page 152 can be connected to a respective contact pad in a driving circuit, e.g., X-decoder (or a scanning driver).

A cell string 154 includes a number of memory cells 157 connected in series vertically along the Z direction, where a memory cell can be configured as an SST coupled to a string select line (SSL) 156 and a memory cell can be configured as a GST coupled to a ground select line (GSL) 158. The cell strings 154 are connected to one or more drivers, e.g., data drivers. The cell strings 154 of the memory cells 157 are connected to a common source line (CSL) 159 via the ground select transistors (GSTs). The CSL 159 can be a conductive layer (or multiple conductive lines) formed on a substrate of the 3D memory. The CSL 159 can be coupled to the ground or a supply voltage.

Figure 2A:
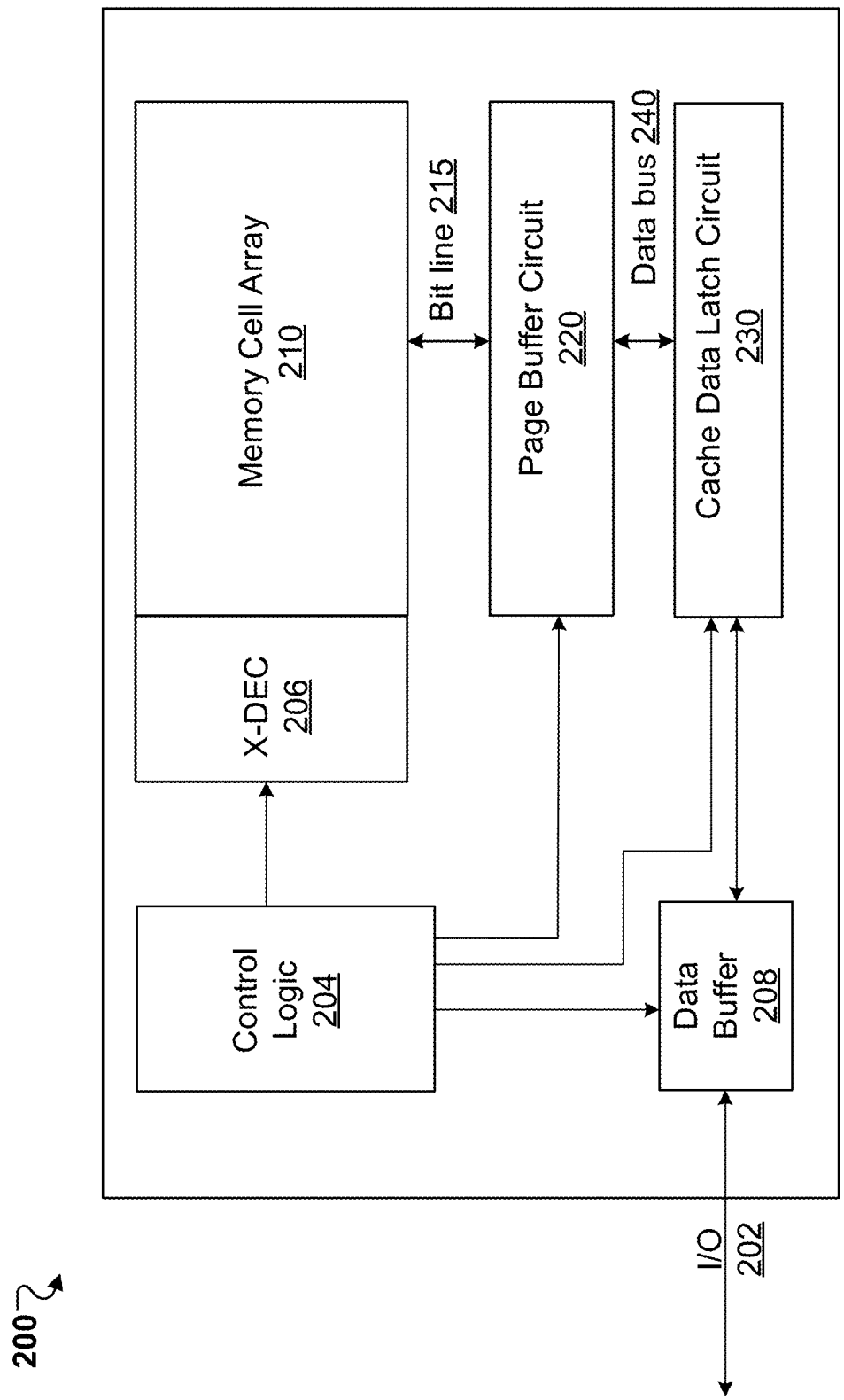
FIG. 2A illustrates an example of a memory device including a page buffer circuit.

FIG. 2A illustrates an example configuration of a memory device 200. The memory device 200 can be implemented as the memory device 116 of FIG. 1A. The memory device 200 includes a memory cell array 210. The memory cell array 210 can include a number of memory cells, e.g., the memory cells 141 of FIG. 1B or the memory cells 157 of FIG. 1C, coupled in series to a number of row word lines and a number of column bit lines.

A memory cell can include a memory transistor configured as a storage element. The memory transistor can include a silicon-oxide-nitride-oxide-silicon (SONOS) transistor, a floating gate transistor, a nitride read only memory (NROM) transistor, or any suitable non-volatile memory metal-oxide-semiconductor (MOS) device that can store charges.

The memory device 200 includes a memory interface 202 having multiple input/output (I/O) ports for receiving data, e.g., from a controller such as the device controller 112 or the host controller 122 of FIG. 1A, or outputting data from the memory cell array 210. The memory device 200 includes a data buffer 208 configured to buffer data received and outputted through the memory interface 202.

The memory device 200 further includes an X-decoder (or row decoder) 206 and optionally a Y-decoder. Each memory cell is coupled to the X-decoder 206 via a respective word line and coupled to the Y-decoder via a respective bit line 215. Accordingly, each memory cell can be selected by the X-decoder 206 and the Y-decoder for read or write operations through the respective word line and the respective bit line 215.

Figure 2B:
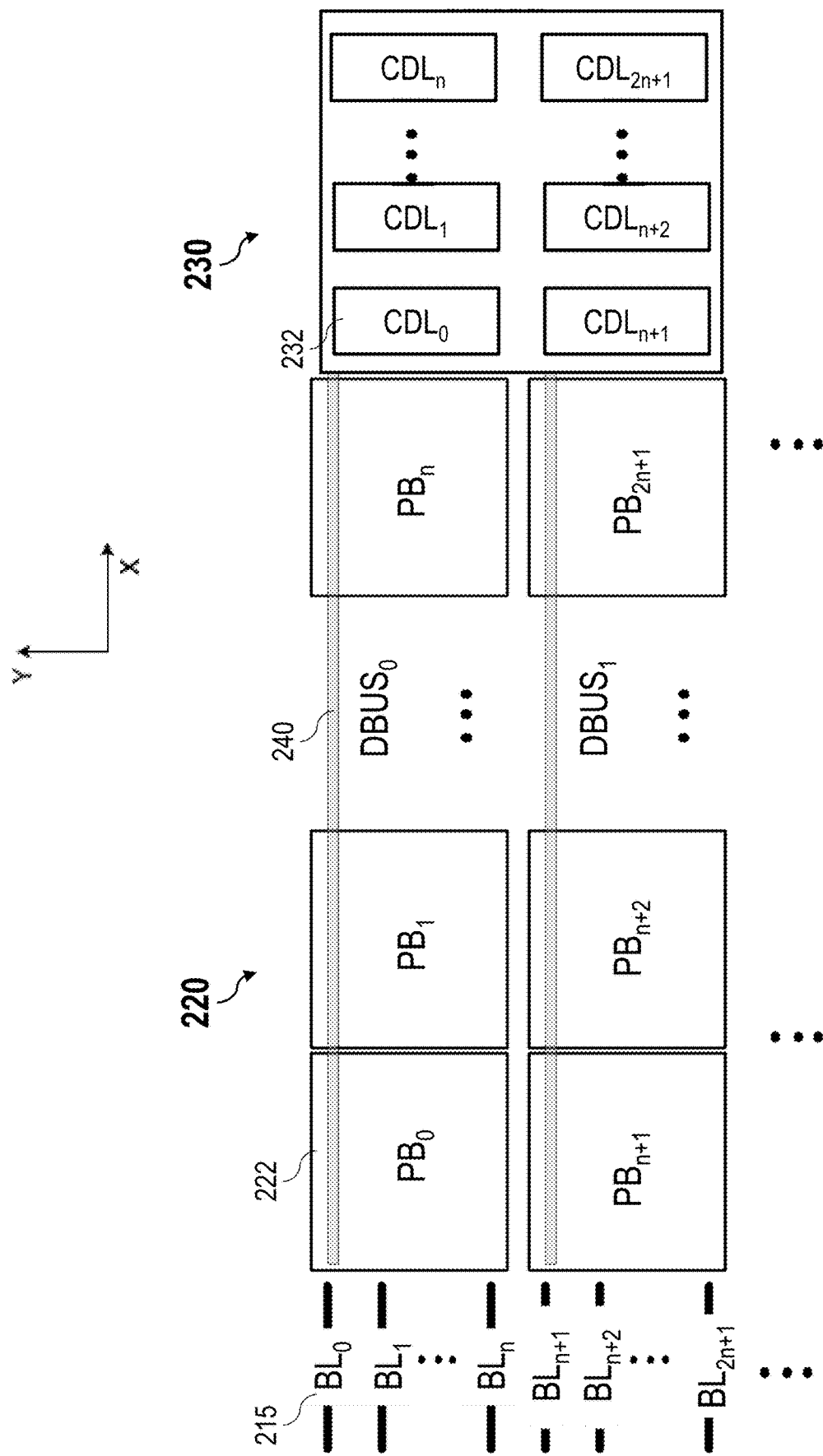
FIG. 2B illustrates an example of a page buffer circuit connected to a cache circuit.

The memory device 200 includes a page buffer circuit 220 coupled to the memory cell array 210 through the bit lines 215 and a cache circuit 230, such as a cache data latch (CDL), coupled to the page buffer circuit 220 through a data bus 240. The data bus 240 can include one or more conductive lines (e.g., metal lines or metal routing). As described for implementations of the present disclosure, the data bus 240 can be a configurable data bus formed by internal data lines (IDLs) of page buffers of the page buffer circuit 220, e.g., the data bus 240 can be a portion of the page buffer circuit 220 and need not include dedicated metal lines. The page buffer circuit 220 can include a number of page buffers. Each page buffer can have a length along a horizontal direction (e.g., X direction) and a width along a vertical direction (e.g., Y direction), e.g., as illustrated in FIG. 2B. The page buffer includes multiple latches that can be made of a number of transistors. The transistors can be arranged along the length of the page buffer, e.g., the horizontal direction such as the X direction. The transistors can be conductively connected with one another by inner metal routing lines in the page buffer, including, e.g., a metal lines for the IDL. Description of the internal transistors of each page buffer is provided in reference to FIGS. 3A-3C.

FIG. 2B illustrates an example of the page buffer circuit 220 connected to the cache circuit 230 using data buses 240. As an example, the page buffer circuit 220 includes 2*N page buffers 222 ($PB_0$, $PB_1$, ..., $PB_n$, $PB_{n+1}$, $PB_{n+2}$, ..., $PB_{2n+1}$) that can be separated into multiple columns or rows (e.g., 2), where n is an integer, e.g., in a range from 10 to 16, and where N=n+1. Each column or row can include N page buffers 222 that can be sequentially arranged along the lengths of the page buffers (e.g., the horizontal direction such as X direction). Each page buffer 222 (e.g., $PB_0$, $PB_1$, ..., $PB_n$, $PB_{n+1}$, $PB_{n+2}$, ..., $PB_{2n+1}$) is coupled to the memory cell array 210 through a respective bit line 215 (e.g., $BL_0$, $BL_1$, ... $BL_n$, $BL_{n+1}$, $BL_{n+2}$, ..., $BL_{2n+1}$). Moreover, each page buffer 222 is coupled to the cache circuit 230 through a data bus line 240 (e.g., $DBUS_0$ or $DBUS_1$). A column or row of page buffers 222 sequentially arranged along the horizontal direction can share the same corresponding data bus line 240. A data bus line 240 for each row or column can be formed by IDLs of the page buffers 222 of the row or column. For example, one or more IDLs of page buffers 222 in a first row ($PB_0$, $PB_1$, ..., $PB_n$) can be coupled to one another to form $DBUS_0$ that couples one or more of the page buffers 222 in the first row to the cache circuit 230, and one or more IDLs of page buffers 222 in a second row ($PB_{n+1}$, $PB_{n+2}$, ..., $PB_{2n+1}$) can be coupled to one another to form $DBUS_1$ that couples one or more of the page buffers 222 in the second row to the cache circuit 230. In some implementations, additional data bus line(s) in the cache circuit 230 (not shown in FIG. 2B) couple the data bus line 240 to a respective cache 232 (e.g., a respective latch $CDL_0$, $CDL_1$, ..., $CDL_n$, $CDL_{n+1}$, $CDL_{n+2}$, ..., $CDL_{2n+1}$) in the cache circuit 230 for each page buffer 222. The respective bit lines 215 for a column or row of page buffers can be arranged along the width of the page buffer 222 (e.g., the vertical direction such as Y direction).

The cache circuit 230 is not restricted to a circuit that includes one cache or latch for each page buffer, but, rather, can include any circuit configured to receive (e.g., and store) data from one or more page buffers (e.g., in one or more caches). Moreover, although some examples described herein include a cache circuit to receive data through a DBUS formed by IDLs, in some implementations, the page buffer circuits described herein (e.g., including multiple page buffers, each having an IDL, where the IDLs are configured to be conductively connected together to form a DBUS for data transfer) need not be coupled to a cache circuit.

With continued reference to FIG. 2A, in some embodiments, a page buffer 222 is connected to the Y-decoder through a data line associated with a corresponding bit line 215 that connects one or more memory cells in the memory cell array 210 to the page buffer 222. The page buffer 222 can be configured to control a voltage on a corresponding bit line to perform an operation, e.g., read, program, or erase, on a memory cell coupled to the corresponding bit line 215. In some embodiments, during a program or erase operation, the cache circuit 230 is configured to store data from the data buffer 208 and/or output to one or more page buffers 222 in the page buffer circuit 220. During a read operation, the cache circuit 230 is configured to store data from one or more page buffers 222 in the page buffer circuit 220 and/or output data to the data buffer 208.

As shown in FIG. 2A, the memory device 200 can further include a control logic 204 coupled to components in the memory device 200 including the X-decoder 206 and the Y-decoder, the data buffer 208, the page buffer circuit 220, and the cache circuit 230. The control logic 204 can be configured to receive a command, address information, and/or data, e.g., from a controller such as the device controller 112 or the host controller 122 of FIG. 1A, via the memory interface 202. The control logic 204 can also process the command, the address information, and/or the data, for example, to generate physical address information, e.g., of blocks/pages, in the memory cell array 210. The control logic 204 can include circuitry, e.g., an integrated circuit integrating multiple logics, circuits, and/or components. In some implementations, the control logic 204 includes at least one of a data register, an SRAM buffer, an address generator, a mode logic, or a state machine. The mode logic can be configured to determine whether there is a read or write operation and provide a result of the determination to the state machine.

During a write operation, the data register in the control logic 204 can register input data from the interface 202, and the address generator in the control logic 204 can generate corresponding physical addresses to store the input data in specified memory cells of the memory cell array 210. The address generator can be connected to the X-decoder 206 and the Y-decoder that are controlled to select the specified memory cells through corresponding word lines and bit lines. The SRAM buffer can retain the input data from the data register in its memory as long as power is being supplied. The state machine can process a write signal from the SRAM buffer and provide a control signal to a voltage generator that can provide a write voltage to the X-decoder 206 and/or the Y-decoder. The Y-decoder is configured to output the write voltage to the bit lines (BLs) for storing the input data in the specified memory cells.

During a read operation, the state machine can provide control signals to the voltage generator and the page buffer circuit 220. The voltage generator can provide a read voltage to the X-decoder 206 and the Y-decoder for selecting a memory cell. A page buffer 222 can sense a small power signal (e.g., a current signal) that represents a data bit ("1" or "0") stored in the selected memory cell through a bit line 215 coupled to the page buffer 222 and the selected memory cell. A sense amplifier can amplify the small power signal swing to recognizable logic levels so the data bit can be interpreted properly by logic inside or outside the memory device 200. In some implementations, at least one of the page buffer circuit 220 or the cache circuit 230 is included in the sense amplifier. The data buffer 208 can receive the amplified voltage from the sensor amplifier and output the amplified power signal to the logic outside the memory device 200 through the memory interface 202.

Figure 3A:
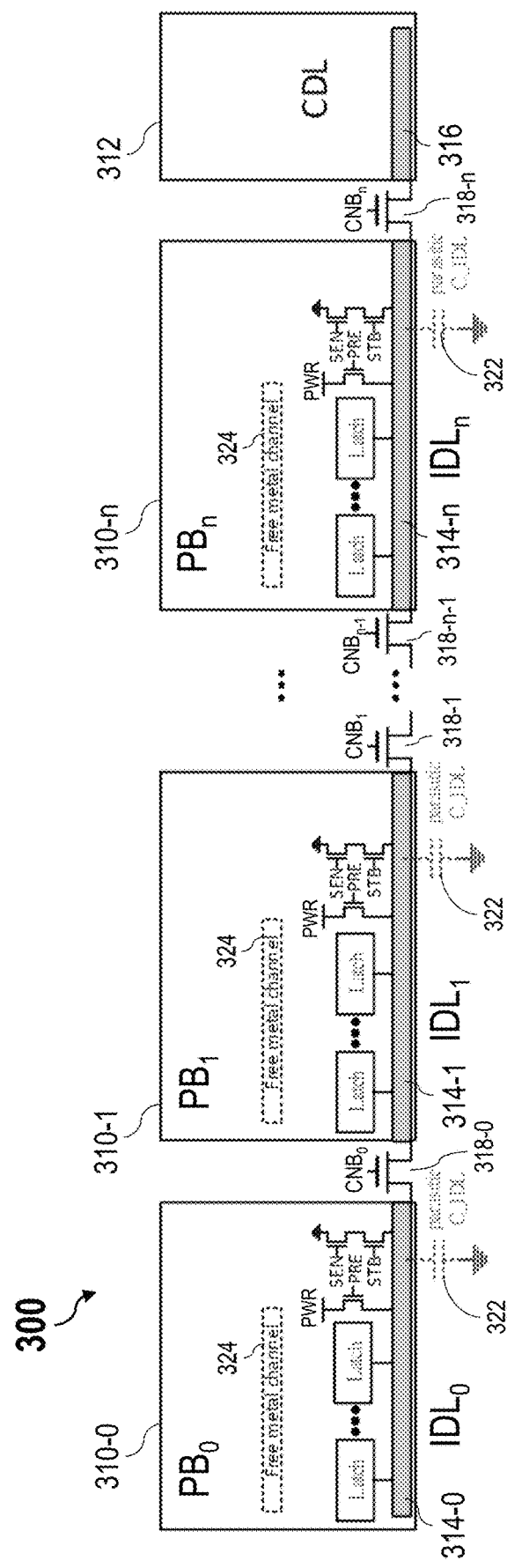
FIG. 3A illustrates an example of a page buffer circuit.

FIG. 3A illustrates page buffers 310 (310-0, 310-1, ..., 310-n) in a row or column of a page buffer circuit 300, e.g., page buffer circuit 220. The page buffers 310 include respective IDLs 314 (314-0, 314-1, ..., 314-n) that can be conductively connected to one another to form a configurable data bus, e.g., for transferring data between the page buffers 310 and/or from the page buffers 310 to a cache circuit 312 (e.g., cache circuit 230, such as a CDL circuit). For example, the page buffers 310 can be the page buffers 222 ($PB_0$, $PB_1$, ..., $PB_n$) in the first row of the page buffer circuit 220 illustrated in FIG. 2B. The page buffer circuit 310 can include additional rows/columns including additional page buffers (not shown).

Figures 3B, 3C:
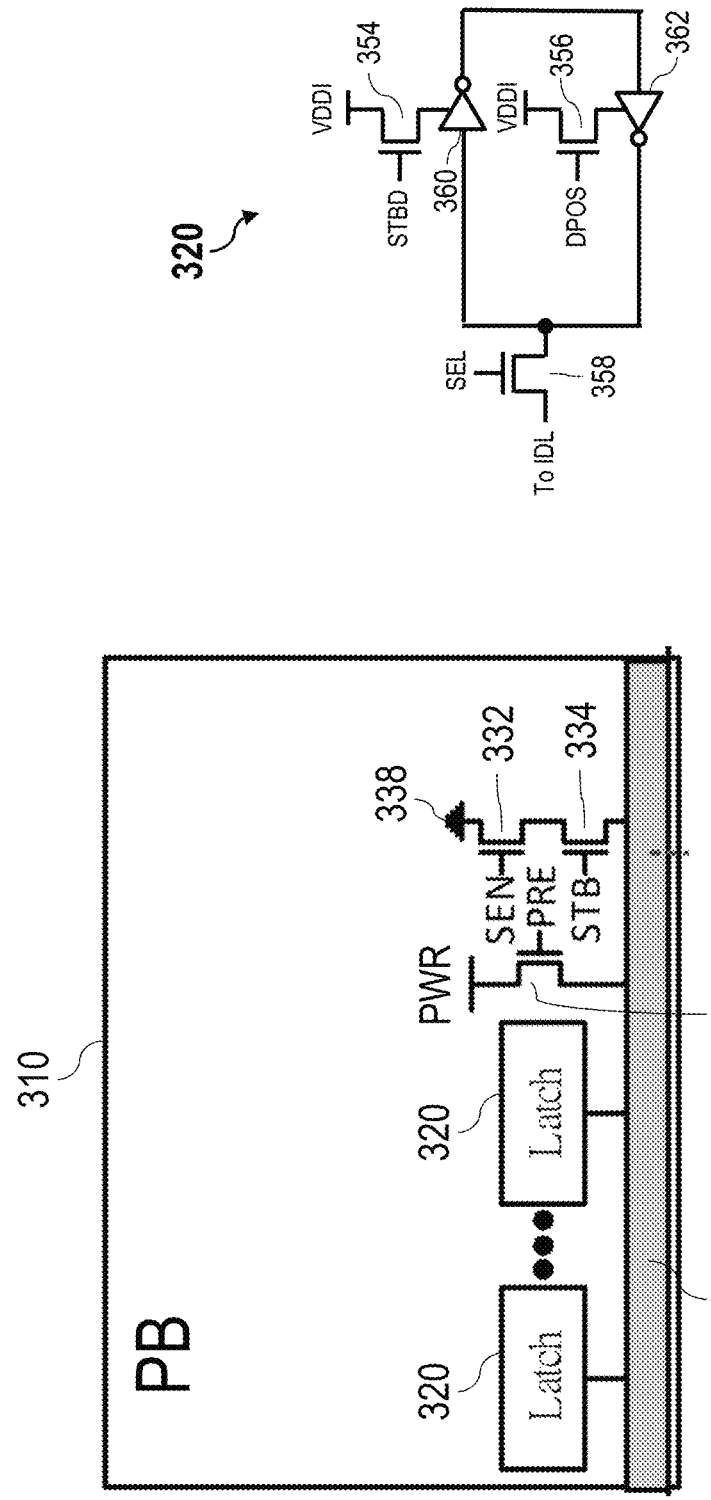
FIG. 3B illustrates an example of a page buffer of a page buffer circuit.
FIG. 3C illustrates an example of a latch of a page buffer.

FIGS. 3B-3C illustrate an example of an internal structure of each page buffer 310. Each page buffer 310 includes one or more latches 320 individually coupled to the IDL 314 of the page buffer 310. The IDL 314 is arranged to couple to the latches 320. An example of a latch 320, illustrated in FIG. 3C, includes three transistors 354, 356, and 358 and two inverters 360 and 362. Transistor 356 is configured to receive a corresponding signal DPOS, and transistor 354 is configured to receive a corresponding standby signal STBD. The transistors 354 and 356 and the inverters 360 and 362 in combination form a tri-state latch that can take on "0" or "1" states based on reading out memory cells coupled to a bit line coupled to the page buffer 310. In various implementations, different types of latch units can be included in each latch 320. For example, fighting latch units, or any suitable latch units, can be included. In addition, page buffers for different types of memory cells can have different numbers of latches 320 in each page buffer 310. For example, if the memory cell type of a memory cell is single-level cell (SLC), the page buffer 310 for the memory cell can include two latches 320; if the memory cell type of a memory cell is multi-level cell (MLC), the page buffer 310 can include three latches 320; if the memory cell type of a memory cell is triple-level cell (TLC), the page buffer 310 can include five latches 320. Latch number need not depend on cell level, or need not depend exclusively on cell level. Rather, latch number can instead or additionally be based on quick pass write (QPW) configuration and/or another configuration of a page buffer. Transistor 358 is a select transistor that can be toggled on/off (based on a signal SEL at a gate of the select transistor 358) to couple/decouple the latch 320 from the IDL 314. For example, to read data to a given latch 320, the select transistor 358 of the latch 320 can be turned on, and select transistors 358 of other latches 320 in the page buffer 310 can be turned off.

The page buffer 310 further includes a precharge transistor 336 configured to couple the IDL 314 to a supply voltage (PWR). The precharge transistor 336 can be turned on (based on a signal PRE at a gate of the precharge transistor 336) to precharge the IDL 314 using the supply voltage. Also included in the page buffer 310 is a sensing transistor 332 and a strobe transistor 334. The sensing transistor 332 is configured to sense a state of a memory cell of the memory cell array. For example, a gate of the sensing transistor 332 can be coupled to a SEN signal that turns the sensing transistor 332 on or off based on the state of the memory cell. When the sensing transistor 332 turns on, the turning on indicates the state of the memory cell. For example, the turning on can cause the IDL 314 to be coupled to a ground 338 that pulls down a voltage level of a latch. The page buffer 310 can include additional circuitry (e.g., one or more additional transistors, resistors, and/or capacitors), not shown in FIG. 3B, coupled to the gate of the sensing transistor 332. During a read operation, one or more of these additional transistor(s) can be controlled by appropriate signal(s) that cause the sensing transistor 332 to sense the state of the memory cell.

The strobe transistor 334 is configured to couple the sensing transistor 332 to the IDL 314. For example, when a sensing operation is to be performed, the strobe transistor 334 can be turned on (e.g., by a signal STB at a gate of the strobe transistor 334), and, when a precharge operation is to be performed, the strobe transistor 334 can be turned off.

Referring again to FIG. 3A, the respective IDLs 314 of each page buffer 310 are controllably coupled to one another by connection transistors 318 (318-0, 318-1, . . . , 310-n). Connection transistors 318-0, 318-1, . . . , 318-n-1 are configured to be turned on to conductively connect a pair of adjacent IDLs 314 corresponding to the connection transistor, and to be turned off to conductively separate the pair of adjacent IDLs 314. For example, when connection transistor 318-0 is on, IDL 314-0 is conductively connected to IDL 314-1, and, when connection transistor 318-0 is off, IDL 314-0 is conductively separated from IDL 314-1. Connection transistor 318-n is coupled between the cache circuit 312 (e.g., a data bus 316 of the cache circuit 312) and the IDL 314-n of the page buffer 310-n adjacent to the cache circuit 312. The connection transistor 318-n is configured to be turned on to conductively connect the IDL 314-n to the cache circuit 312, and to be turned off to conductively separate the IDL 314-n from the cache circuit 312. Each connection transistor 318 includes a gate terminal configured to receive a respective CNB signal to turn the connection transistor 318 on/off; a first terminal (e.g., a source terminal or a drain terminal) conductively connected to a first IDL 314 corresponding to the connection transistor 318; and a second terminal (e.g., the other of the source terminal or the drain terminal) conductively connected to a second IDL 314 corresponding to the connection transistor 318 (or, in the case of connection transistor 318-n, the cache circuit 312).

As described in further detail below in reference to various operations, the connection transistors 318 can be controlled to cause one or more IDLs to form a DBUS (e.g., DBUS 240) between one or more of the page buffers 310 and the cache circuit 312. For example, connection transistor 318-n can be turned on and connection transistor 318-n-1 can be turned off, to form a DBUS that includes IDL 314-n and excludes other IDLs 314. As another example, connection transistors 318-n and 318-n-1 can be turned on and connection transistor 318-n-2 can be turned off, to form a DBUS that includes IDLs 314-n and 314-n-1 and excludes other IDLs 314. The DBUS is segmented into one or more IDLs, where multiple IDLs forming a DBUS are conductively connected to one another through turned-on connection transistors therebetween.

Each IDL 314 has a parasitic capacitance 322 to a circuit ground. The parasitic capacitances 322 cause delays in charging and discharging (pulling down) voltages on the IDLs 314. However, in some implementations, the adjustable length of the DBUS, based on the adjustable number of IDLs 314 included in the DBUS, can allow for reductions in these delays. Details on how the parasitic capacitances 322 may affect the timing of page buffer circuit operations are provided below.

Because the IDLs 314 perform the functions of both internal data lines and data bus lines coupling to the cache circuit 312, in some implementations, the page buffer circuit 300 has a free metal channel 324 compared to page buffer circuits in which separate metal channels are used for IDLs and for a separate, dedicated DBUS. For example, the IDLs 314 can be couplable in series with one another, and arranged physically parallel to one another, in/along a single metal channel that further includes the DBUS when the IDLs 314 are appropriately connected to form the DBUS, rather than using a first metal channel for the IDLs and a second metal channel (e.g., the free metal channel 324) for the DBUS. As the metal pitch in memory devices is reduced with advances in fabrication technology, each portion of area available for fabrication becomes increasingly important. As such, gaining the free metal channel 324 available for other device(s) and/or metal line(s) can allow for increased device density and/or miniaturization, and can facilitate improved local metal routing, improving memory performance and/or capacity.

Figure 4A:
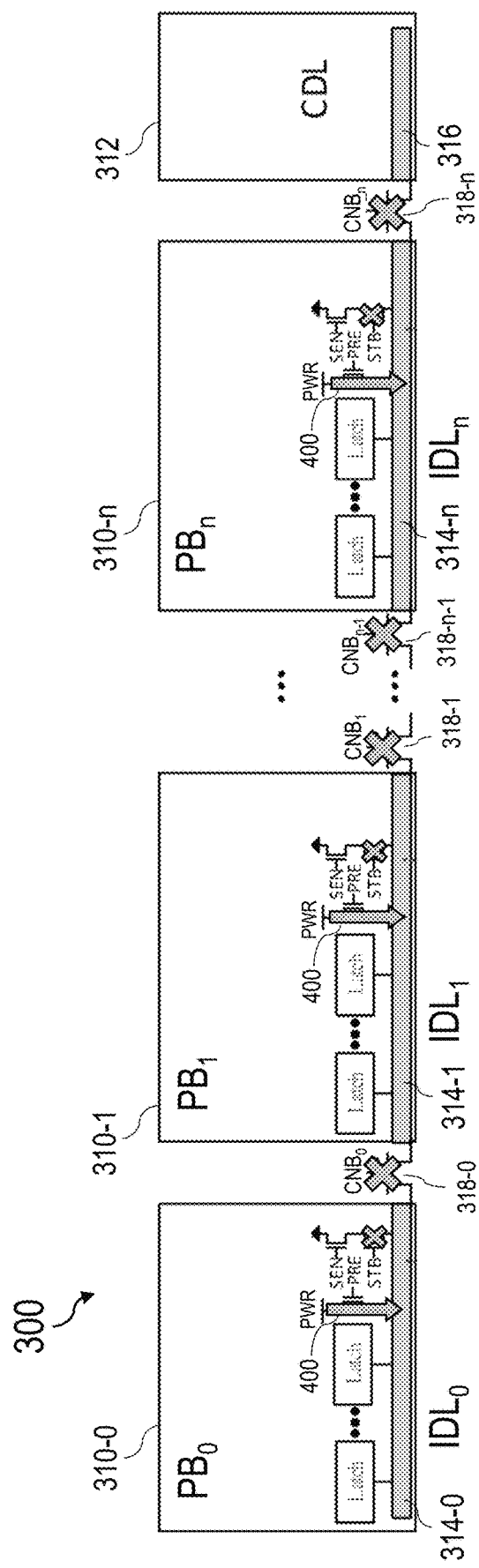
FIG. 4A illustrates an example of precharging a page buffer circuit.
Figure 4B:
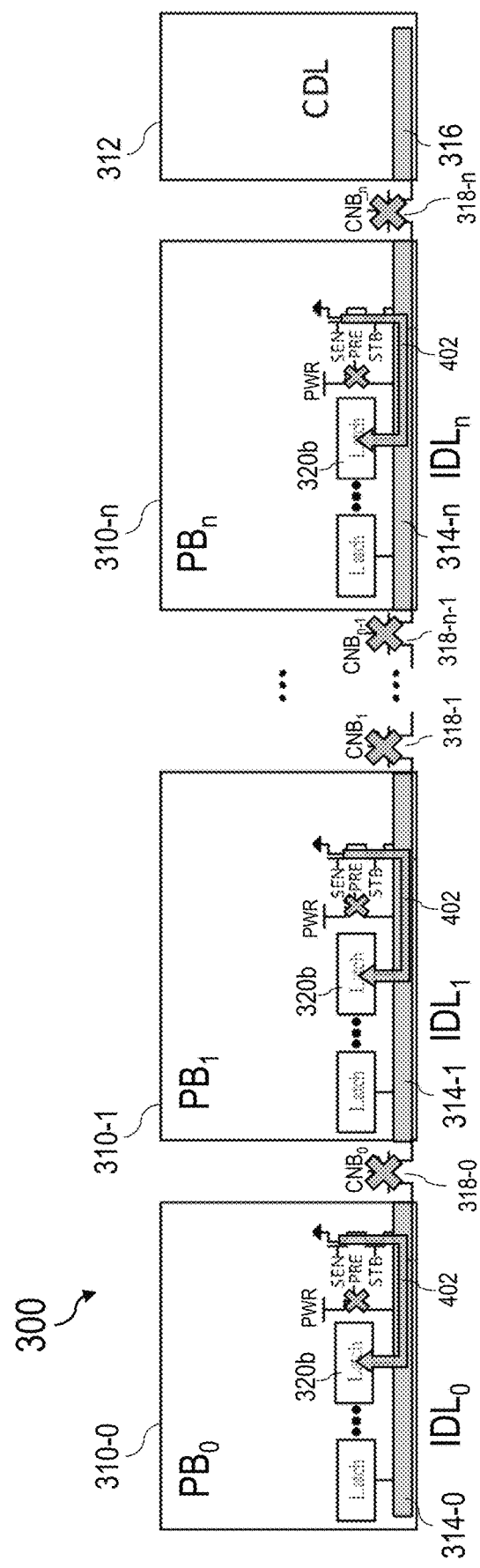
FIG. 4B illustrates an example of data sensing by a page buffer circuit.

FIGS. 4A-4B illustrate an example of a memory cell read (sensing) process using the page buffer circuit 300. As shown in FIG. 4A, precharge transistors of the page buffers 310 are controlled to couple each IDL 314 to a supply voltage, precharging the IDLs 314 to a precharged voltage (400). Connection transistors 318 are turned off, such that each IDL 314 is conductively separated from adjacent IDL(s) 314. The strobe transistor of each page buffer 310 is turned off to conductively separate the IDL 314 of the page buffer 310 from the sensing transistor of the page buffer 310. In some implementations, during precharging, the select transistor of each latch of the page buffer 310 is turned off to conductively separate the latches of the page buffer 310 from the IDL 314 of the page buffer 310.

As shown in FIG. 4B, at least partially after the precharging, and while the IDLs 314 are conductively separated from one another by turned-off connection transistors 318, at least one transistor in each page buffer 310 is controlled to cause data in a memory cell coupled to the page buffer 310 to be sensed and transferred through the IDL 314 of the page buffer 310 into a latch (e.g., latches 320b illustrated in FIG. 4B) of the page buffer 310 (402). As a non-limiting example, one or more transistors in a bit line control circuit of the page buffer 310 (not shown) can be controlled to couple a sensing node (e.g., a gate terminal of the sensing transistor) to a bit line coupled to the memory cell. In some implementations, at least some of these operations can occur during the precharging, e.g., so that, as the IDL 314 is being precharged, at least one transistor is being controlled to cause the sensing transistor to sense the state of the memory cell. The strobe transistor can be turned off at least during precharging, so that the sensing transistor is conductively separated from the IDL 314 until after the precharging.

To transfer the sensed data to the latch 320b, the strobe transistor of each page buffer 310 can be turned on to conductively connect the IDL 314 to the sensing transistor, which has a state based on the state of the coupled memory cell. Based on the state, the precharged IDL 314 can discharge or not discharge through the sensing transistor. For example, in some implementations, the IDL 314 discharges through the sensing transistor (e.g., to ground or to another voltage) if the state of the memory cell corresponds to bit "0," or the IDL 314 can remain at the precharged voltage if the state of the memory cell corresponds to bit "1." These operations are performed while the connection transistors 318 are turned off, such that each IDL 314 can be discharged or remain at its precharged voltage independently of other IDLs 314.

The select transistor of the latch 320b can be turned on so that the latch 320b stores data corresponding to a voltage level of the IDL 314. For example, the latch can store a "0" level voltage if the IDL 314 has discharged, or the latch can store a "1" level voltage if the IDL 314 remains at the precharged voltage. Accordingly, the state of the memory cell is sensed and stored in the latch 320b. In some implementations, the strobe transistor and the select transistor are turned on simultaneously; in some implementations, the strobe transistor is first turned on to discharge or not discharge the IDL 314 based on the state of the memory cell, and then the select transistor is turned on to store the sensed data in the latch 320b.

As shown in FIGS. 4A-4B, the read operation can be performed for all page buffers 310 in parallel and/or for a subset of the page buffers 310, e.g., one or more page buffers. For a page buffer of one or more page buffers for which the read operation is performed, the IDL 314 of the page buffer is conductively separated from other IDLs 314 (and, in some implementations, from the cache circuit 312) by turning off at least one connection transistor 318 coupled to the IDL 314, and at least one transistor of the page buffer 310 is controlled to perform the read operation.

The transistors of the page buffers 310 (e.g., sensing transistor, strobe transistor, precharge transistor, and select transistor(s) of latch(es)), among other possible transistor(s)) and the connection transistors 318 are controlled by control circuitry of the memory device having the page buffer circuit 300, the control circuitry configured to perform the control. For example, the control circuitry can include the control logic 204 illustrated in FIG. 2A, e.g., which can implement a state machine that provides appropriate signals to gates of the transistors to turn the transistors on or off. Description herein of transistors as being "turned on" or "turned off" are equivalent to description of the control circuitry (e.g., the control logic 204) being configured to turn the transistors on or off with the described timings/configurations. Moreover, description herein of control circuitry being configured to conductively connect elements, or conductively separate the elements, is equivalent to description of the control circuitry being configured to control one or more transistors (e.g., using control signal(s)) to conductively connect or conductively separate the elements.

In some implementations, the control signals used to perform the read operation of FIGS. 4A-4B are wholly or partially the same as control signals used to perform read operations in alternative page buffer circuits, e.g., page buffer circuits in which the DBUS is separate from IDLs of page buffers. These alternative page buffer circuits may include alternative page buffers with the same latch circuitry, precharge transistor, strobe transistor, and sensing transistor as the page buffers 310, and the IDLs of the alternative page buffers may be coupled to a common, distinct DBUS (separate from the IDLs) by respective CNB transistors that are turned off during read operations. Accordingly, to perform a read operation using the page buffer circuit 300, the control signals to control transistors of the page buffers 310 can be the same as the control signals used to control transistors of the alternative page buffers having IDLs distinct from the DBUS, while the control signals used to control the connection transistors 318 can be the same as the control signals used to control the CNB transistors that couple the IDLs of the alternative page buffers to the DBUS. Accordingly, in some cases, to convert control circuitry from controlling read operations of the alternative page buffer circuit to controlling read operations of the page buffer circuit 300, few or no changes may be necessary, potentially providing the benefits of decreased conversion cost and increased control circuitry interoperability.

Figure 5A:
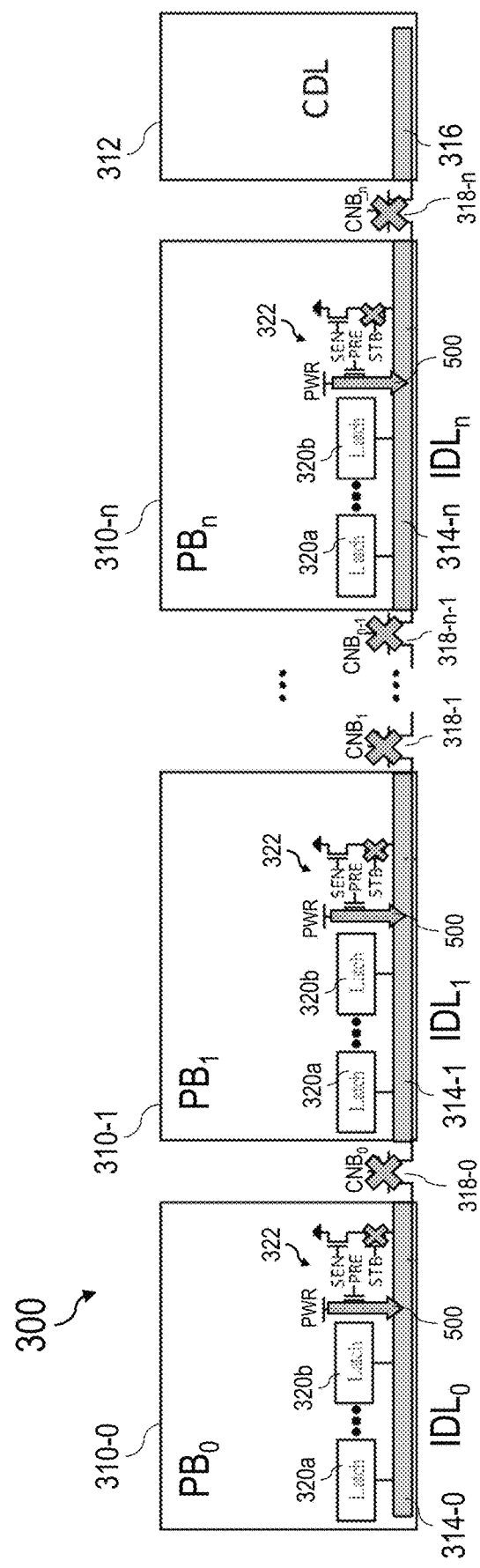
FIG. 5A illustrates an example of precharging of a page buffer circuit.
Figure 5B:
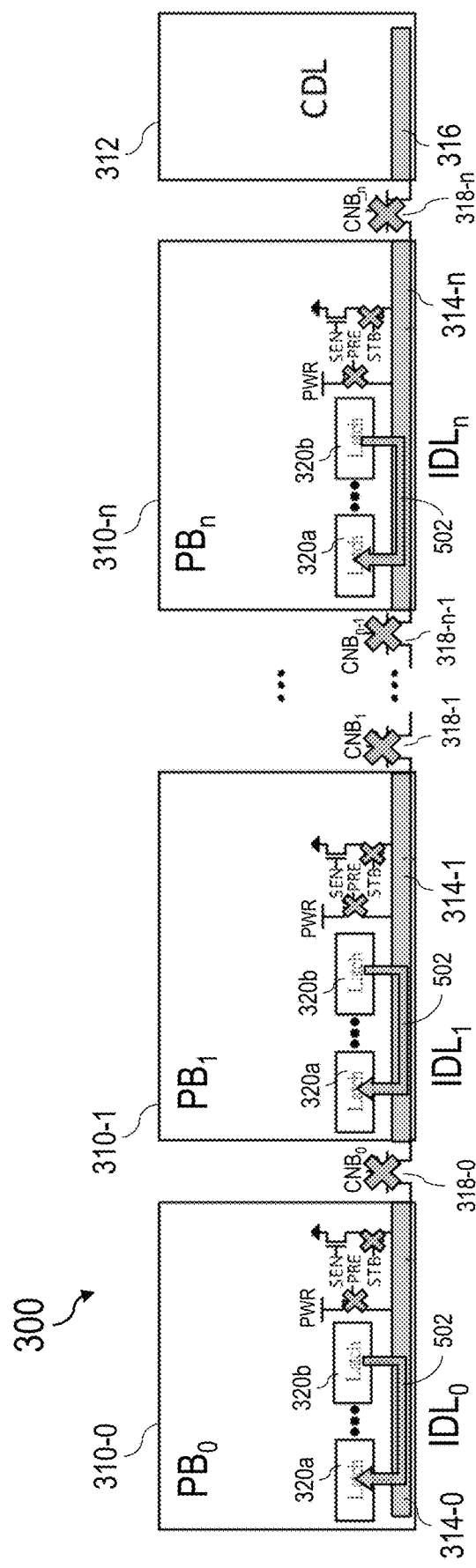
FIG. 5B illustrates an example of data transfer between latches of page buffers of a page buffer circuit.

FIGS. 5A-5B illustrate an example of latch-latch data transfer (e.g., from latch 320b to latch 320a) within page buffers 310 of the page buffer circuit 300. As shown in FIG. 5A, precharge transistors of the page buffers 310 are controlled to couple each IDL 314 to a supply voltage, precharging the IDLs 314 to a precharged voltage (500). The connection transistors 318 can be turned off to conductively separate the IDLs 314 from one another. The precharging operation illustrated in FIG. 5A can be the same as the precharging operation illustrated in and described in reference to FIG. 4A, e.g., based on the same transistor operation set by the same control circuitry configuration as described for the precharging operation of FIG. 4A.

As shown in FIG. 5B, after the IDLs 314 are precharged, and while the connection transistors 318 are off to conductively separate the IDLs 314 from one another, at least one transistor of each page buffer 310 is controlled to cause data stored in a first latch of the page buffer (e.g., latch 320b) to be transferred, through the IDL 314 of the page buffer 310, to a second latch of the page buffer (e.g., latch 320a) (502). For example, the precharge transistors and the strobe transistors of the page buffers 310 can be turned off, and the latches 320a, 320b can be conductively connected to the IDL 314, e.g., by turning on respective select transistors of the latches 320a, 320b. For example, latch 320b (from which data is to be transferred) can be conductively connected to the IDL 314, and the IDL 314 discharges to the latch 320b if the latch 320b stores state "0," or the IDL 314 remains at the precharged voltage if the latch 320a stores state "1." Latch 320a can subsequently be conductively connected to the IDL 314 (e.g., while latch 320b remains conductively connected to the IDL 314), and the latch 320a stores data corresponding to the voltage level of the IDL 314. For example, the latch 320a can store "0" if the IDL 314 is at a discharged voltage level, or the latch 320a can store "1" if the IDL 314 is at the precharged voltage level. The target latch 320a to which data is transferred can be in a floating state before being conductively connected to the IDL 314, such that the data transfer is in a single direction from latch 320b to latch 320a.

As described for the read operation illustrated in FIGS. 4A-4B, the latch-latch data transfer operation can be performed for all page buffers 310 in parallel and/or for a subset of the page buffers 310, e.g., one or more page buffers. For a page buffer of one or more page buffers for which the latch-latch data transfer operation is performed, the IDL 314 of the page buffer is conductively separated from other IDLs 314 (and, in some implementations, from the cache circuit 312) by turning off at least one connection transistor 318 coupled to the IDL 314, and at least one transistor of the page buffer 310 is controlled to perform the latch-latch data transfer operation.

Figure 6A:
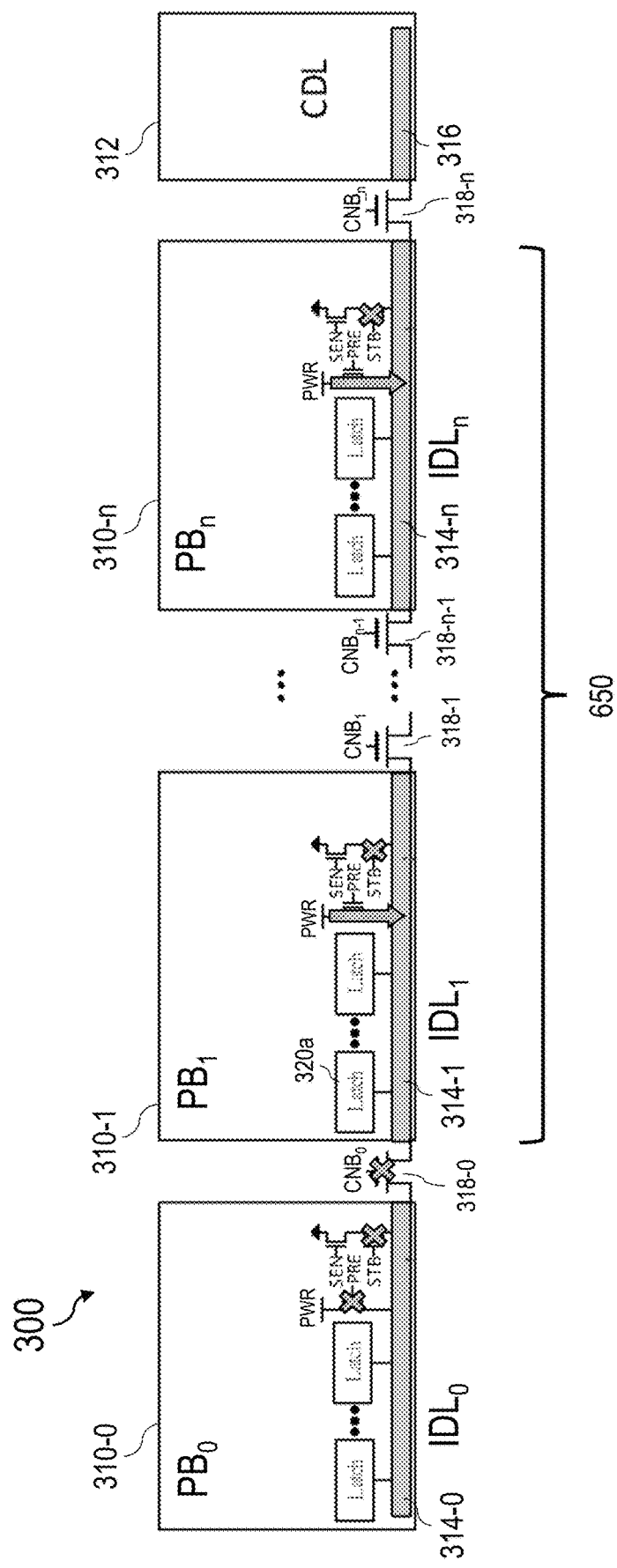
FIG. 6A illustrates an example of precharging a page buffer circuit.
Figure 6B:
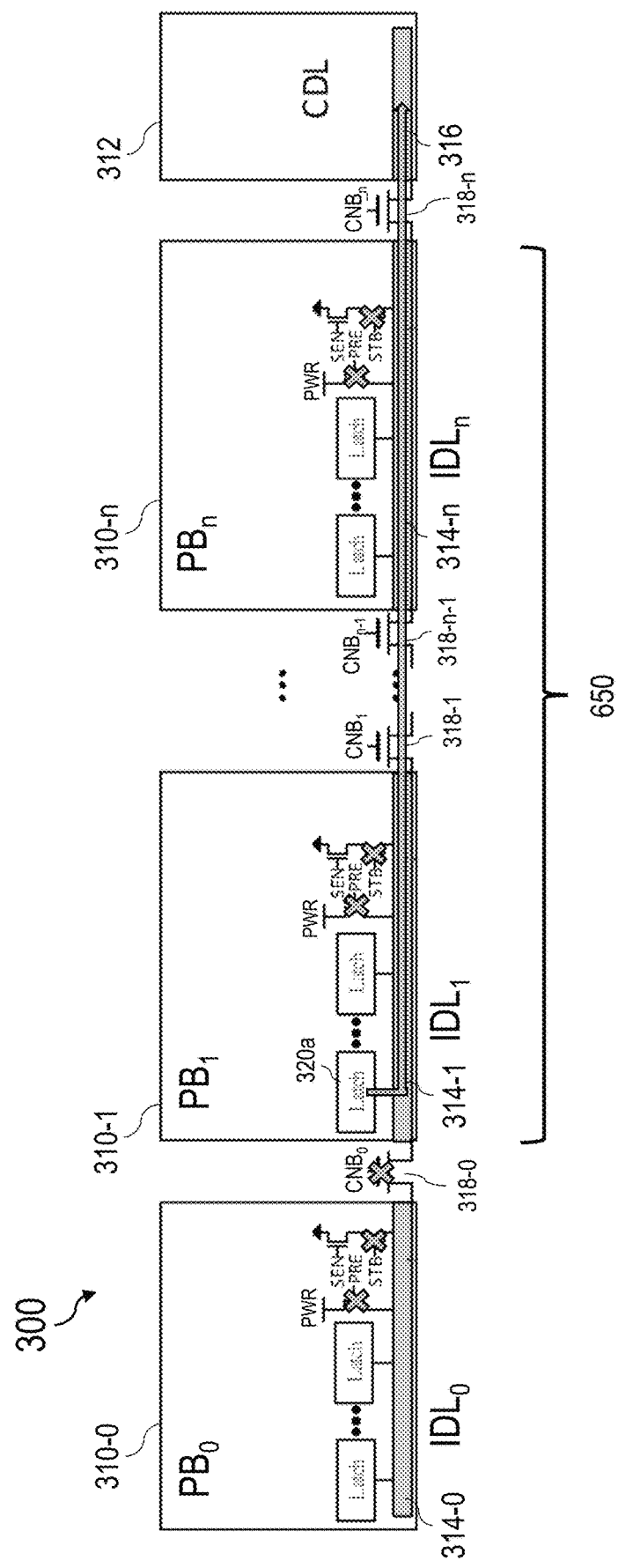
FIG. 6B illustrates an example of data transfer from a page buffer to a cache circuit.
Figure 6C:
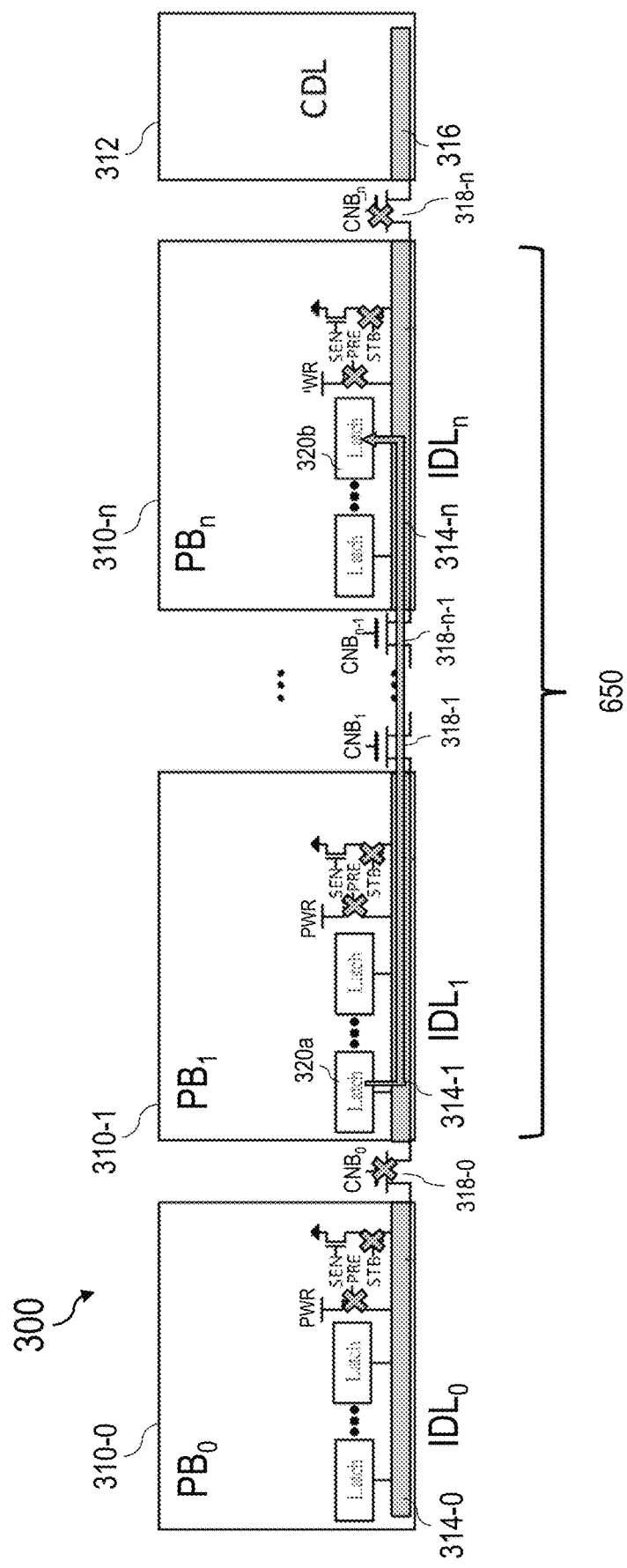
FIG. 6C illustrates an example of data transfer between page buffers of a page buffer circuit.

As further described for the read operation illustrated in FIGS. 4A-4B, control signals to control transistors for the latch-latch data transfer operation for page buffer circuit 300 can be wholly or partially the same as control signals used to perform latch-latch data transfer operations in alternative page buffer circuits, e.g., the above-described page buffer circuits in which the DBUS is separate from IDLs of page buffers. For example, to perform a latch-latch data transfer operation using the page buffer circuit 300, the control signals to control transistors of the page buffers 310 can be the same as the control signals used to control transistors of the alternative page buffers having IDLs distinct from the DBUS, while the control signals used to control the connection transistors 318 can be the same as the control signals used to control the CNB transistors that couple the IDLs of the alternative page buffers to the DBUS. Accordingly, in some cases, to convert control circuitry from controlling latch-latch data transfer operations of the alternative page buffer circuit to controlling latch-latch data transfer operations of the page buffer circuit 300, few or no changes may be necessary, potentially providing the benefits of decreased conversion cost and increased control circuitry interoperability FIGS. 6A-6C illustrate examples of a page buffer-cache data transfer operation (FIGS. 6A-6B) and a page buffer-page buffer data transfer operation (FIGS. 6A and 6C) using the page buffer circuit 300. These operations can including turning on at least one connection transistor 318 to conductively connect multiple IDLs to one another, e.g., to form a DBUS that includes multiple IDLs 314. FIGS. 6A-6B illustrate operations to transfer data from page buffer 310-1 to the cache circuit 312, while FIGS. 6A and 6C illustrate operations to transfer data from latch 320a of page buffer 310-1 to latch 320b of page buffer 310-n.

As shown in FIG. 6A, connection transistors 318-1, ..., 318-n-1 are turned on to conductively connect IDLs 314-1, ..., 314-n to one other in series, to form a DBUS 650 that includes IDLs 314-1, ..., 314-n. Connection transistor 318-0 is turned off, such that IDL 314-0 is conductively separated from the DBUS 650 (e.g., conductively separated from the adjacent IDL 314-1), and the DBUS 650 excludes IDL 314-0. The IDLs 314-1, ..., 314-n are coupled to the supply voltage, e.g., by turning on one or more precharge transistors of the page buffers 310-1, ..., 310-n having the IDLs 314-1, ..., 314-n. In some implementations, precharge transistors of all the page buffers 310-1, ..., 310-n are turned on, such that the DBUS 650 is precharged through all the corresponding page buffers 310-1, ..., 310-n. In some implementations, precharge transistor(s) of one or more of the page buffers 310-1, ..., 310-n are turned on to precharge the DBUS 650. Strobe transistors of the page buffers 310 can be turned off during the precharging. Connection transistor 318-n can be turned on or off during the precharging, in various implementations. For any of the implementations described throughout this disclosure, during precharging of a DBUS including one or more conductively-connected IDLs, the IDLs can be conductively connected to the cache circuit (e.g., by turning on a connection transistor between the IDLs and the cache circuit) or the IDLs can be conductively separated from the cache circuit (e.g., by turning off the connection transistor). For example, in some implementations, connection transistor 318-n is turned on during precharging. In some implementations, connection transistor 318-n is turned off during precharging, and the cache circuit 312 can include an internal precharging sub-circuit, such as a precharging transistor connected to a precharging voltage.

As shown in FIG. 6B, at least one transistor of page buffer 310-1 (having the latch 320a from which data is to be transferred) is controlled to cause data stored in the page buffer 310-1 to be transferred through the DBUS 650 to the cache circuit 312. For example, when the DBUS 650 has been precharged, the precharge transistors of the page buffers 310 are turned off, and the latch 320a from which data is to be transferred can be conductively connected to the DBUS 650, e.g., by turning on the select transistor of the latch 320a. Connection transistor 318 is also turned on (if not already turned on), to conductively connect the DBUS 650 to the cache circuit 312 (e.g., to the data bus 316 of the cache circuit 312). Accordingly, data is transferred from the latch 320a, through the DBUS 650, and to the cache circuit 312. The data can be transferred based on discharge of the precharged DBUS 650. For example, in some implementations, if the latch 320a stores "0," the precharged DBUS 650 discharges to the latch 320a and has a discharged voltage (e.g., ground), and the cache circuit 312 is conductively connected to the discharged voltage so as to obtain "0." Alternatively, if the latch 320a stores "1," the precharged DBUS 650 remains at the precharged voltage, and the cache circuit 312 is conductively connected to the precharged voltage so as to obtain "1."

In some implementations, the transferred data is stored in the cache circuit 312. For example, the data can be stored in a particular cache (e.g., a cache 232 illustrated in FIG. 2B) corresponding to page buffer 310-1.

The data transfer process illustrated in FIGS. 6A-6B can, in some implementations, provide a speedup compared to some other processes, based on the configurability of the DBUS. In some implementations, when data is being transferred from a given page buffer to a cache circuit, the DBUS is configured to include fewer than all of the available IDLs. For example, the DBUS can be configured to include only the IDLs that are necessary to form the DBUS extending from the page buffer to the cache circuit. For example, connection transistors can be controlled such that the IDL of the page buffer from which data is transferred is the conductively farthest IDL of the DBUS from the cache circuit, and such that the IDL of the page buffer is conductively separated from an adjacent IDL that is conductively farther from the cache circuit than the IDL of the page buffer. For example, as illustrated in FIGS. 6A-6B, IDL 314-1 (of page buffer 310-1 from which data is being transferred) is the conductively farthest IDL 314 from the cache circuit 312 among the IDLs 314-1, . . . , 314-n included in the DBUS 650. Connection transistor 318-0 is off such that the DBUS 650 is conductively separated from IDL 314-0 (adjacent to IDL 314-1), which, being conductively farther from the cache circuit 312 than IDL 314-1, need not be included in the DBUS 650 to facilitate data transfer from page buffer 310-1 to the cache circuit 312.

Because the DBUS can be configured to include fewer than all of the IDLs, the DBUS can, in some implementations, require less time to charge and to perform data transfer than an alternative DBUS that has a length equal to the combined length of all the IDLs (e.g., an alternative DBUS that is separate from the IDLs and extends to couple to each page buffer). As an example, assume that a parasitic capacitance C associated with each DBUS segment (e.g., segment having a length of one IDL), such as capacitance 322 illustrated in FIG. 3A, sets a time $t_{pre} \propto C$ to precharge the DBUS segment and a time $t_{trans} \propto C$ to transfer data through the DBUS segment. If the DBUS has a length equivalent to all N=n+1 IDLs corresponding to a series of page buffers (e.g., IDLS 314-0, 314-1, . . . , 314-n), then the total time to charge the DBUS is $Nt_{pre}$, and the time to transfer data through the DBUS is $Nt_{trans}$, because the capacitance of the DBUS as a whole is approximately proportional to the total area of the DBUS, which is proportional to the number of DBUS segments that form the DBUS. In an example process, data is transferred once from each page bus to the cache circuit, for N total transfers. Then, the total time for all transfers is $T_{total,1} = (Nt_{pre} + Nt_{trans}) \cdot N = N^2(t_{pre} + t_{trans})$.

However, if, for data transfer from each page buffer, the DBUS is configured as shown in FIGS. 6A-6B—that is, to include only the IDLs on a conductive path between the page buffer and the cache circuit—then the time for each DBUS precharging and for each data transfer is reduced, because the DBUS is shorter than a DBUS that includes all IDLs (except for the case where data is being transferred from the conductively-farthest IDL from the cache circuit).

FIGS. 7A-7E illustrate an example process of sequential data transfer from multiple page buffers 710 in a page buffer circuit 700 to a cache circuit 712, e.g., a CDL circuit. The page buffer circuit 700 and elements thereof can have the characteristics described for page buffer circuit 300 and elements thereof. For example, each page buffer 710 can include one or more latches 720 (e.g., having characteristics as described for latches 320), an IDL 714 (e.g., having characteristics as described for IDLs 314), a precharge transistor 736 (e.g., having characteristics as described for precharge transistors 336), a strobe transistor (not illustrated in FIGS. 7A-7E), and a sensing transistor (not illustrated in FIGS. 7A-7E). The page buffer circuit 700 includes connection transistors 718 configured to couple respective adjacent pairs of IDLs 714, e.g., having characteristics as described for connection transistors 318). Although the page buffers 710 are illustrated as each having a single latch 720, in some implementations the page buffers 710 can include two, three, or more latches each, e.g., as described for the page buffers 310.

As shown in FIG. 7A, in the sequential data transfer process, to transfer data from latch 720-0 of page buffer 710-0, control circuitry is configured to control the connection transistors 718 to form a DBUS 750a that includes IDLs 714-0, 714-1, . . . , 714-n. e.g., configured to turn on connection transistors 718-1, 718-2, . . . , 718-n. The DBUS 750a begins with page buffer 710-0 and extends from page buffer 710-0 to the cache circuit 712. One or more of the precharge transistors 736 are turned on to precharge the DBUS 750a (701a), e.g., as described in reference to FIG. 6A.

As shown in FIG. 7B, the precharge transistors 736 are turned off, and one or more transistors of the page buffer 710-0 are controlled to transfer data from the latch 720-0, through the DBUS 750a, and to the cache circuit 712 (703a), e.g., as described in reference to FIG. 6B. For example, a select transistor of the latch 720-0 can be turned on to conductively connect the latch 720-0 to the DBUS 750a.

Figures 7C, 7D:
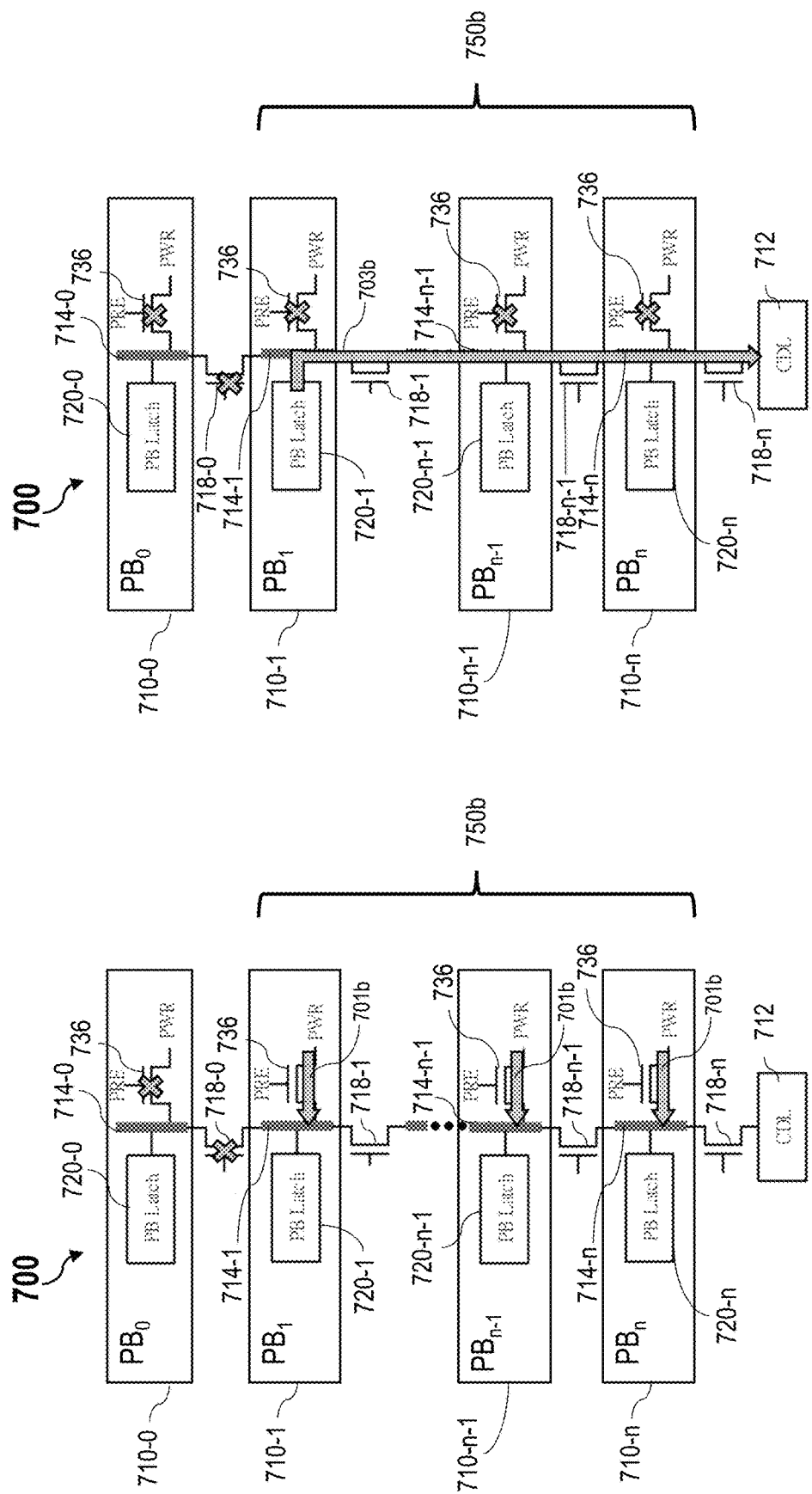

The sequential data transfer process continues to transfer data from latch 720-1 of page buffer 710-1. As shown in FIG. 7C-7D, connection transistors 718-1, . . . , 718-n are turned on, and connection transistor 718-0 is turned off, to form a DBUS 750b that begins with page buffer 710-1 and extends from page buffer 710-1 to the cache circuit 712. The DBUS 750b is conductively separated from IDL 714-0. The DBUS 750b is precharged through one or more precharge transistors 736 of the page buffers 710-1, . . . , 710-n (701b). As shown in FIG. 7D, the precharge transistors 736 are turned off, and one or more transistors of page buffer 710-1 are controlled to transfer data from latch 720-1 to the cache circuit 712 (703b). For example, a select transistor of the latch 720-1 can be turned on to conductively connect the latch 720-1 to the DBUS 750b. Because DBUS 750b is shorter than DBUS 750a (includes one less IDL), the times consumed in precharging the DBUS 750b and transferring data through the DBUS 750b are less than the corresponding times for DBUS 750a.

The sequential data transfer process can continue to transfer data from a latch of each page buffer 710 to the cache circuit 712 in turn. In each sequential data transfer, a corresponding DBUS is formed to begin with the IDL of the page buffer from which data is being transferred (e.g., such that the IDL is the farthest IDL of the DBUS from the cache circuit), and to extend to the cache circuit 712, so that the DBUS does not include extraneous length (extraneous IDLs) that would contribute to the capacitance of the DBUS without being necessary for data transfer. As shown in FIG. 7E, to transfer data from page buffer 710-n, conductively closest to the cache circuit 712 (e.g., after transferring data from page buffers 710-0, . . . , 710-n-1), connection transistors 718-0, . . . , 718-n-1 are turned off, and connection transistor 718-n is turned on, such that a corresponding DBUS 750c includes the IDL 714-n and is conductively separated from the other IDLs 714-0, . . . , 714-n-1. Precharge transistor 736 of page buffer 710-n is turned on to charge the DBUS 750c (701c). As shown in FIG. 7F, one or more transistors of page buffer 710-n are controlled to cause data to be transferred from latch 720-n, through the DBUS 750c, and to the cache circuit 712 (703c). For example, a select transistor of the latch 720-n can be turned on to conductively connect the latch 720-n to the DBUS 750c.

The time consumed in performing the data transfer process of FIGS. 7A-7E can be reduced compared to the time consumed in data transfer using a DBUS that includes all the IDLs or that has a length equivalent to all the IDLs. Using the notation provided above, the time for precharging DBUS 750*a* and transferring data using DBUS 750*a* (as shown in FIGS. 7A-7B) is (Nt$_{pre}$+Nt$_{trans}$), because DBUS 750*a* includes N IDLs. However, the time for precharging DBUS 750*b* and transferring data using DBUS 750*b* (as shown in FIGS. 7C-7D) is ((N−1)t$_{pre}$+(N−1)t$_{trans}$), because DBUS 750*b* includes (N−1) IDLs. Correspondingly, the time for precharging DBUS 750*c* and transferring data using DBUS 750*c* (as shown in FIGS. 7E-7F) is (1·t$_{pre}$+1·t$_{trans}$). Accordingly, the time to transfer data from each page buffer 710-0, 710-1, . . . , 710-*n* to the cache circuit 712 is $$T_{total,2} = (1 \cdot t_{pre} + 1 \cdot t_{trans}) + (2 \cdot t_{pre} + 2 \cdot t_{trans}) + \ldots + (N \cdot t_{pre} + N \cdot T_{trans}) = \frac{1}{2}(N)(N+1)(t_{pre} + t_{trans}),$$

an approximately 50% speedup (e.g., for large N) compared to the above-calculated value $T_{total,1} = N^2(t_{pre}+t_{trans})$ for data transfer using a non-configurable DBUS that always include N segments. For example, in the case of N=12, $T_{total,1}$=144·(t$_{pre}$+t$_{trans}$), while $T_{total,2}$=78·(t$_{pre}$+t$_{trans}$). In some implementations, this speedup can facilitate faster memory operations such as readout, storage, error correction, and/or transfer.

Figure 8:
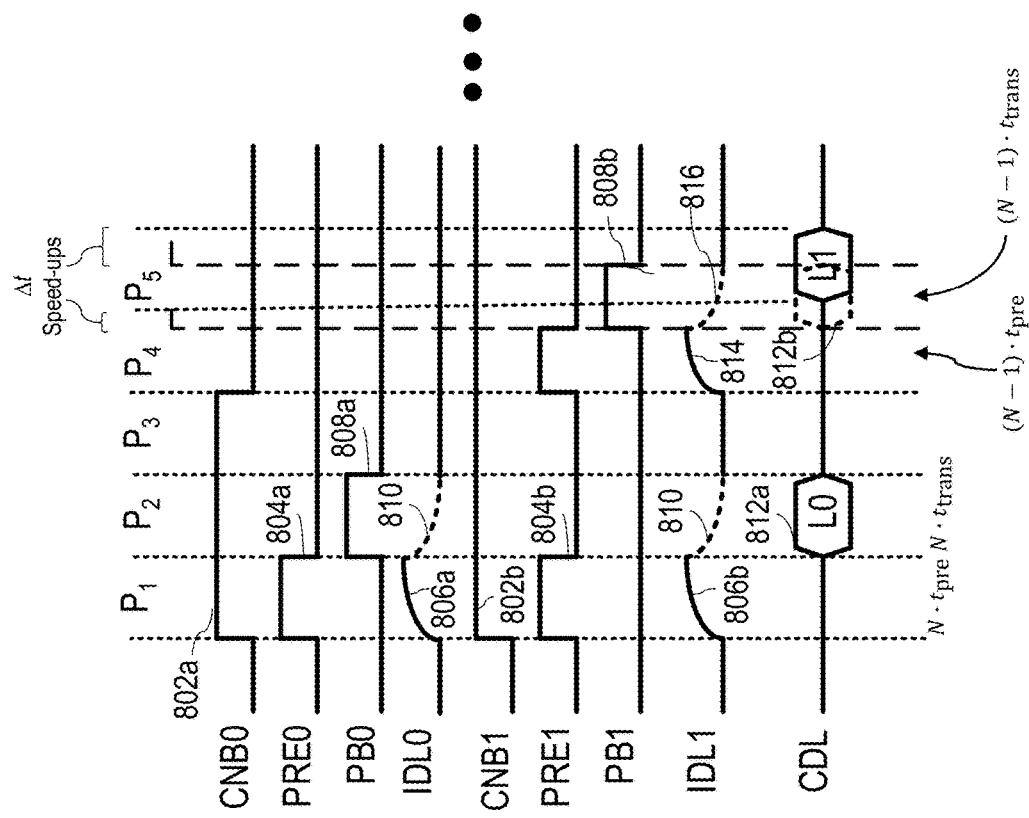
FIG. 8 shows a timing diagram illustrating signals and voltage levels in a page buffer circuit during sequential data transfer.

FIG. 8 illustrates signals associated with data transfer by the process of FIGS. 7A-7D. "CNB0" and "CNB1" are gate signals provided to connection transistors 718-0 and 718-1, respectively; PRE0 and PRE1 are signals provided to precharge transistors 736 of page buffers 710-0 and 710-1, respectively; PB0 and PB1 are signals provided to one or more transistors of page buffers 710-0 and 710-1, respectively (e.g., select transistors of latches 720-0 and 720-1, respectively) to cause data in the page buffer 710-0 or 710-1 to transfer from the page buffer 710-0 or 710-1 to the cache circuit 712; IDL0 and IDL1 are voltage levels of IDLs 714-0 and 714-1, respectively; and CDL represents data received at the cache circuit 712. Signals corresponding to other page buffers of the page buffer circuit 700 are not shown.

As shown in FIG. 8, in a first phase P1 (e.g., as shown in FIG. 7A), CNB0 and CNB1 signals 802*a*, 802*b* are high signals, turning on at least connection transistors 718-0 and 718-1, to form DBUS 750*a* that includes at least IDLs 714-0 and 714-1. PRE0 and PRE1 signals 804*a*, 804*b* are high signals, conductively connecting at least IDLs 714-0 and 714-1 to a supply voltage to precharge the DBUS 750 through at least the precharge transistors 736 of page buffers 710-0, 710-1. In association with the precharging to a precharged voltage, the voltage levels IDL0, IDL1 806*a*, 806*b* increase to a precharged voltage. As described above, the precharging consumes a time Nt$_{pre}$, based on the N IDLs 714 included in the DBUS 750*a*.

In a second phase P2, PRE0 and PRE1 signals 804*a*, 804*b* are low signals, turning off the precharge transistors 736. PB0 signal 808*a* is set to a high signal (e.g., turning on a select transistor of latch 720-0). The DBUS 750*a*, having the voltage levels IDL0, IDL1 806*a*, 806*b*, discharges (810), resulting in transfer of data (e.g., "0") from latch 720-0 to the cache circuit 712 via the DBUS 750*a* (812*a*). As described above, the data transfer consumes a time Nt$_{trans}$, based on the N IDLs 714 included in the DBUS 750*a*.

An optional third phase P3 is an example of a "dummy cycle" or "dummy interval" in which controlled transistors remain in the states of the previous phase, e.g., without new control operations being performed. The introduction of a dummy interval can reduce signal racing errors that may cause undesired/incorrect operations. Such dummy intervals may be introduced not only with the illustrated timing between P2 and P4 but, instead or additionally, at other time(s), such as between P1 and P2. Some implementations do not include a dummy interval; rather, operations can proceed, for example, from P2 directly to a fourth phase P4.

In the fourth phase P4, CNB0 signal 802*a* is controlled to be a low signal, turning off connection transistor 718-0 and contributing to forming DBUS 750*b*, which is conductively separated from IDL 714-0 and which includes IDL 714-1 (with CNB1 signal 802*b* remaining a high signal). DBUS 750*b* is precharged (814) to the precharged voltage by providing a high signal as PRE1 804*b*, while IDL 714-0 (as shown by voltage level IDL0 806*a*), conductively separated from the DBUS 750*b*, is not precharged in this example. As described above, the precharging consumes a time (N−1)t$_{pre}$, based on the N−1 IDLs 714 included in the DBUS 750*b*. This represents a speedup compared to the time Nt$_{pre}$ if the DBUS 750*b* were as large as DBUS 750*a*. For example, P4 can be shorter than P4 would be if the DBUS 750*b* were as large as DBUS 750*a*.

In a fifth phase P5, a low signal is provided as PRE1 804*b* to terminate precharging, and a high signal is provided as PB1 808*b* (e.g., to turn on a select transistor of latch 720-1), causing data (e.g., "0") to be transferred from page buffer 710-1 to the cache circuit 712 (812*b*). In association with the data transfer, the DBUS 750*b* (including IDL 714-1) discharges (816). As described above, the data transfer consumes a time (N−1)t$_{trans}$, based on the N−1 IDLs 714 included in the DBUS 750*b*. This represents a speedup compared to if the DBUS 750*b* were as large as DBUS 750*a*. For example, P5 can be shorter than P5 would be if the DBUS 750*b* were as large as DBUS 750*a*.

Similar processes, including use of a DBUS formed by conductively connecting multiple IDLs together, can be used to transfer data from a first page buffer to a second page buffer along a common DBUS. Referring to FIGS. 6A and 6C, for page buffer-page buffer data transfer, the DBUS 650 is precharged as described in reference to FIG. 6A. Connection transistor 318-*n* can be turned off during the precharging and during data transfer, because, for page buffer-page buffer data transfer, the DBUS 650 need not be coupled to the cache circuit 312. The connection transistors 318 can be controlled to form the DBUS 650 such that the DBUS 650 begins with the IDL 314-1 of the first page buffer 310-1 and extends to (e.g., ends with) the IDL 314-*n* of the second page buffer 310-*n*, where the first page buffer 310-1 and the second page buffer 310-*n* are the page buffers between which data is to be transferred in this example. For example, the connection transistors 318 can be controlled such that either or both of the IDLs 314-1, 314-*n* are conductively separated from an adjacent IDL (e.g., IDL 314-0) and/or from the cache circuit 312. The connection transistors 318 can be controlled to form the DBUS 650 such that the DBUS 650 includes only the IDLs 314 that are necessary to form the DBUS 650 between the first and second page buffers 310-1, 310-*n*.

As shown in FIG. 6C, the precharge transistors are turned off, and one or more transistors of at least one of the first page buffer 310-1 or the second page buffer 310-*n* are controlled to transfer data from a latch of the first page buffer 310-1 to a latch of the second page buffer 310-*n*. For example, a select transistor of latch 320*a* of the first page buffer 310-1 can be turned on, and a select transistor of latch 320*b* of the second page buffer 310-*n* can be turned on, to transfer data through the DBUS 650 from latch 320*a* to latch 320b. For example, in some implementations, latch 320b is initially in a floating state (e.g., a floating "1" state), and, if latch 320a stores "0," the precharged DBUS 650 discharges and causes latch 320b (conductively connected to the DBUS 650) to store "0," while, if latch 320a stores "1," the precharged DBUS 650 remains at the precharged voltage and causes latch 320b to store "1."

The potential timing advantages provided by the configurable DBUS for data transfer to the cache circuit, as described in reference to FIGS. 6A-6B, 7A-7F, and 8, can, in some implementations, apply to page buffer-page buffer data transfer using the configurable DBUS. For example, the precharging operation of FIG. 6A can be faster than the same precharging operation if the DBUS 650 included IDL 314-0, and the data transfer operation of FIG. 6C can be faster than the same data transfer operation if the DBUS 650 included IDL 314-0, because the shorter DBUS 650 has a lower total capacitance.

In some implementations, transistors of a page buffer circuit are controlled (e.g., by control circuitry) to cause one or more IDLs of the page buffer circuit to precharge during a same phase as one or more other IDLs of the page buffer circuit are used for data transfer, e.g., between IDLs, between page buffers/latches, and/or between page buffers and a cache circuit. These processes can be referred to as "pipelined" processes. In some implementations, such timings can provide faster page buffer operation, e.g., compared to page buffer circuits that do not include a configurable DBUS including one or more IDLs, and/or compared to sequential, non-pipelined page buffer circuit operation. The pipelining can be facilitated by the configurable DBUSs described herein, e.g., DBUSs formed by IDLs of page buffers coupled to one another by connection transistors.

Figures 9A, 9B:
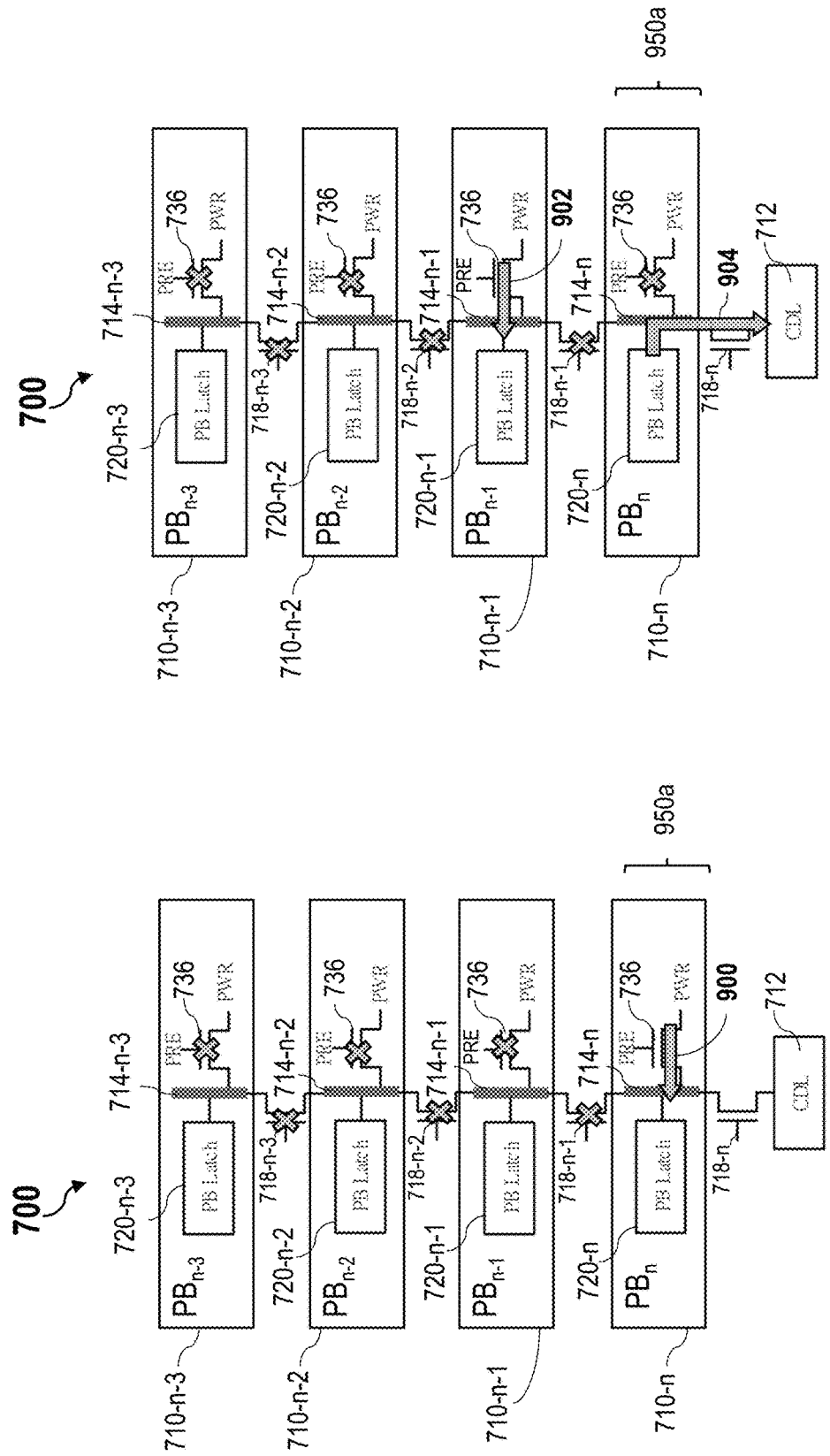
Figures 9E, 9F:
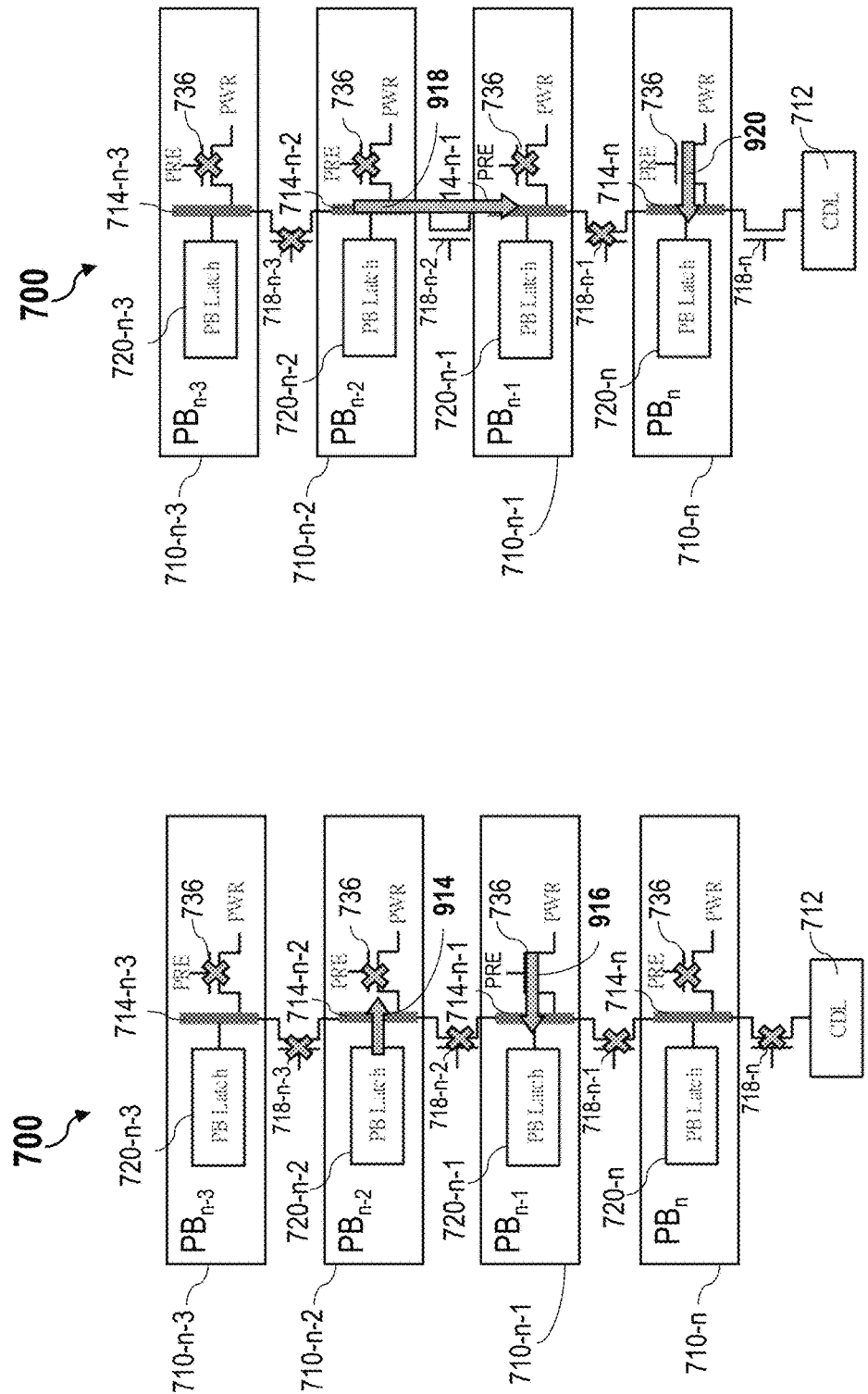
Figures 9G, 9H:
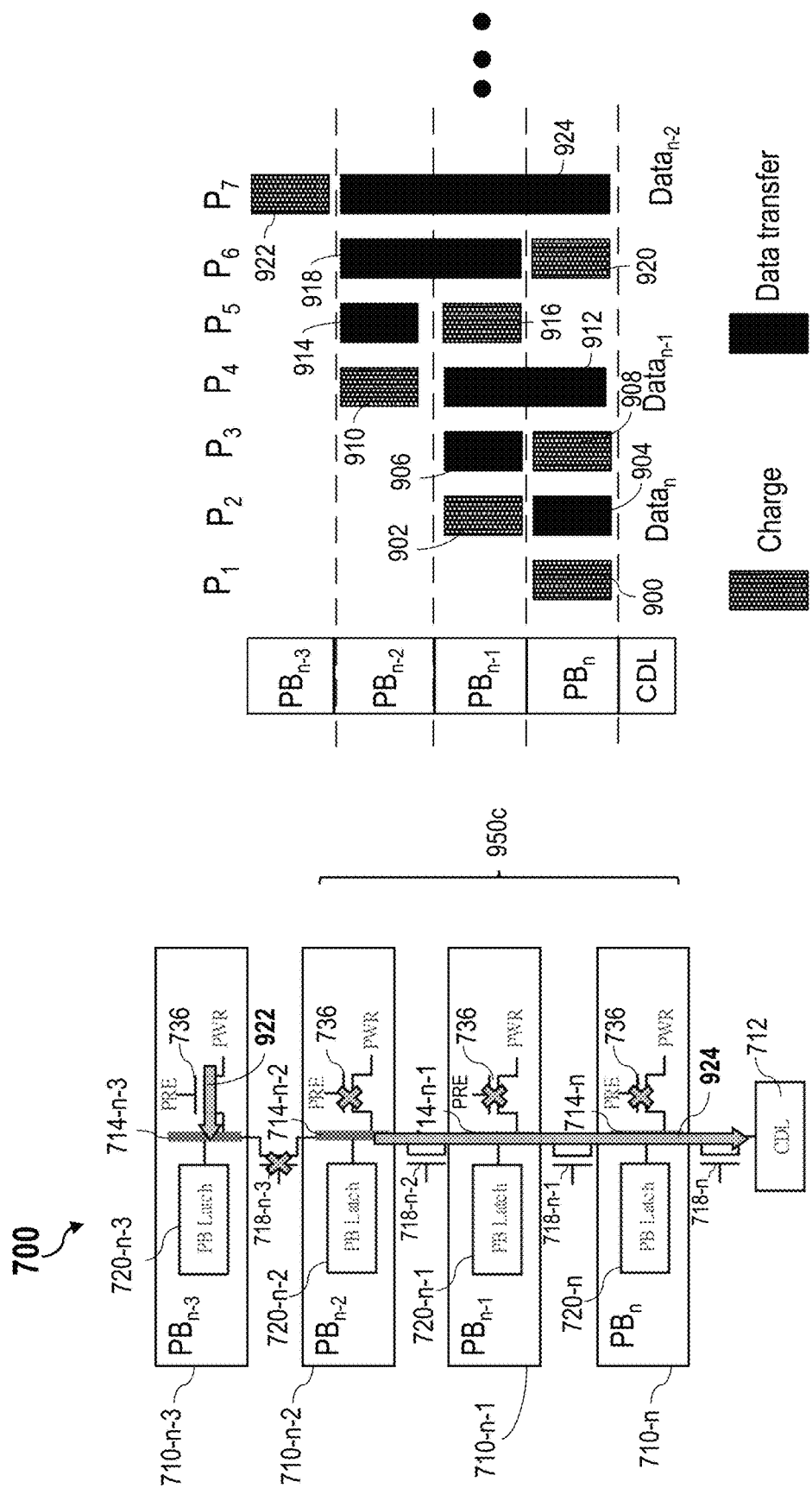

FIG. 9H illustrates page buffer circuit control operations for a portion of a data transfer process including seven phases of operation that are illustrated, respectively, in FIGS. 9A-9G. The data transfer process (only a portion of which is illustrated) can be used to transfer data from each page buffer in a page buffer circuit to a cache circuit coupled to the page buffer circuit. The data transfer process can be performed using the page buffer circuit 700 described in reference to FIGS. 7A-7F. For clarity, only page buffers 710-n-3, 710-n-2, 710-n-1, and 710-n, the four page buffers 710 conductively closest to the cache circuit 712, are illustrated.

In the process illustrated in FIGS. 9A-9G, forming a DBUS and/or forming conductively-connected IDLs can be performed as described in reference to FIGS. 3A-3C, 4A-4B, 5A-5B, 6A-6C, and 7A-7F. e.g., by turning on one or more connection transistors 718 to conductively connect adjacent pair(s) of IDLs 714. Precharging an IDL, precharging conductively-connected IDLs, or precharging a DBUS can be performed as described in reference to FIGS. 3A-3C, 4A-4B, 5A-5B, 6A-6C, and 7A-7F, e.g., by coupling the IDL, the conductively-connected IDLs, or the DBUS to a supply voltage, such as by turning on one or more precharge transistors 736 of one or more corresponding page buffers 710. Transferring data from a latch, or from one or more first conductively-connected IDLs, to a DBUS, to one or more second conductively-connected IDLs, or to a cache circuit, can be performed as described in reference to FIGS. 3A-3C, 4A-4B, 5A-5B, 6A-6C, and 7A-7F, e.g., by controlling one or more transistors (such as select transistor(s) and/or connection transistor(s) 718) to couple the latch or the one or more first conductively-connected IDLs, which store the data or to which data has been transferred, to the DBUS, to the one or more second conductively-connected IDLs, or to the cache circuit.

In the pipelined process illustrated in FIGS. 9A-9G, some phases include precharging one IDL and transferring data through/using another IDL, e.g., from a second IDL to a third IDL. That is, IDLs are precharged one at a time (e.g., to form a DBUS) and data is transferred through DBUSs one IDL at a time. Accordingly, in some implementations, for phases set to each have the same duration, each phase consumes a time Max($t_{pre}$, $t_{trans}$).

In some examples according to this disclosure (e.g., using NMOS devices that are based on precharging followed by possible discharging), each IDL must first be precharged before the IDL can be used for data transfer. Accordingly, a general pattern of some implementations of the pipelined process is that, in a phase, an IDL is precharged, and, in the next phase, the IDL receives data transfer (either from adjacent one or more IDLs that have already received data after being precharged, or from a latch of a page buffer that includes the IDL). However, in some implementations, more than one IDL can be precharged in a phase (e.g., two or more conductively-connected IDLs can be precharged) and/or more than one IDL can receive data in a phase (e.g., two or more conductively-connected IDLs can receive data transfer). The connection transistors can be controlled to apportion the IDLs into one or more first IDLs to which data is transferred (e.g., from a latch or from another IDL that received data in a previous phase) and one or more second IDLs that are precharged in preparation for subsequently receiving or transferring data.

As shown in FIG. 9A, in a first phase P1, IDL 714-n, conductively separated from other IDLs 714, is precharged by coupling the IDL 714-n to a supply voltage (900). During precharging, IDL 714-n can be conductively connected to the cache circuit 712 (e.g., by turning on connection transistor 718-n) or can be conductively separated from the cache circuit 712 (e.g., by turning off connection transistor 718-n), in various implementations. IDL 714-n forms a first DBUS 950a.

As shown in FIG. 9B, in a second phase P2, one or more transistors of page buffer 710-n are controlled to transfer data from latch 720-n to the cache circuit 712 through the DBUS 950a (904), e.g., as described in reference to FIG. 7F. Also during the second phase P2 (e.g., at least partially simultaneously to transfer of data from latch 720-n), IDL 714-n-1 (conductively separated from adjacent IDLs 714-n-2, 714-n) is precharged (902). In some alternative, non-pipelined processes, IDL 714-n-1 would be unused while IDL 714-n is being used to transfer data, representing, in some cases, a potential wasted opportunity that causes overall data transfer process to be more time-consuming.

As shown in FIG. 9C, in a third phase P3, IDL 714-n-1, precharged in the second phase P2, receives data from latch 720-n-1 (e.g., by turning on a select transistor of latch 720-n-1). Also during the third phase P3 (e.g., at least partially simultaneously to transferring data to IDL 714-n-1), IDL 714-n is precharged (908). Connection transistor 718-n-1 is turned off to conductively separate IDLs 714-n-1 and 714-n from one another.

As shown in FIG. 9D, in a fourth phase P4, connection transistor 718-n-1 is turned on to transfer data (transferred to IDL 714-n-1 in the third phase P3) from IDL 714-n-1 through the adjacent IDL 714-n (which, together with IDL 714-n-1, forms a DBUS 950b, and which was precharged in the third phase P3 as preparation to receive data) to the cache circuit 712 (912). Accordingly, data from latch 720-n-1 is transferred to the cache circuit 712. Also during the fourth phase P4 (e.g., at least partially simultaneously to transferring data to the cache circuit 712), IDL 714-*n*-2 is precharged. (910) Connection transistors 718-*n*-3, 718-*n*-2 are turned off to conductively separate IDL 714-*n*-2 from the adjacent IDLs 714-*n*-3, 714-*n*-1.

As shown in FIG. 9E, in a fifth phase P5, IDL 714-*n*-2, precharged in the fourth phase P4, receives data from latch 720-*n*-2 (914). Also during the fifth phase P5 (e.g., at least partially simultaneously to transfer of data from latch 714-*n*-2), IDL 714-*n*-1 is precharged (916). Connection transistors 718-*n*-3, 718-*n*-2, 718-*n*-1 are turned off to conductively separate IDLs 714-*n*-2, 714-*n*-1 from adjacent IDLs 714.

As shown in FIG. 9F, in a sixth phase P6, connection transistor 718-*n*-2 is turned on to conductively connect IDL 714-*n*-2 to IDL 714-*n*-1, transferring data (transferred to IDL 714-*n*-2 in the fifth phase P5) from IDL 714-*n*-2 to IDL 714-*n*-1 (918). Also in the sixth phase P6 (e.g., at least partially simultaneously to transfer of data to IDL 714-*n*-1), IDL 714-*n* is precharged (920). Connection transistor 718-*n*-1 is turned off to conductively separate IDL 714-*n* from IDL 714-*n*-1. In some implementations, one or more IDLs can be precharged more than one phase before data is to be transferred to the one or more IDLs. For example, IDL 714-*n* (which receives data in a seventh phase P7) can be precharged in phase P5 rather than phase P6. However, while an IDL is precharged, the IDL may leak, e.g., through one or more connection transistors configured to couple to the IDL. Accordingly, it can be beneficial to precharge IDLs immediately prior to the IDLs' use for data transfer, e.g., in an immediately preceding phase.

As shown in FIG. 9G, in the seventh phase P7, connection transistor 718-*n*-1 is turned on to conductively connect IDLs 714-*n*-2, 714-*n*-1 to IDL 714-*n*, forming DBUS 950c. The data from latch 720-*n*-2, previously transferred to IDLs 714-*n*-2 and 714-*n*-1 in turn, is transferred through DBUS 950c (e.g., to IDL 714-*n*) and to cache circuit 712 (924). Accordingly, data is transferred from latch 720-*n*-2 to the cache circuit 712. Also in the seventh phase P7 (e.g., at least partially simultaneously to transfer of data to IDL 714-*n* and cache circuit 712), IDL 714-*n*-3 is precharged (922) in preparation for subsequent data transfer operations, not shown.

The process illustrated in FIGS. 9A-9G can continue to transfer data from latches 720-0, . . . , 720-*n*-3 to the cache circuit 712. The pipelining of this process can provide a speedup, e.g., compared to other processes in which a DBUS is not configurable and/or in which pipelining is not performed. Given that each phase after the first phase P1 consumes a time $T_{pipe}=\mathrm{Max}(t_{pre}, t_{trans})$ (to allow for whichever operation is longer of precharging an IDL and transferring data to the IDL), the total time to transfer data from each latch 720-0, . . . , 720-*n* is $$T_{total,3} = t_{pre} + t_{pipe} + 2 \cdot t_{pipe} + 3 \cdot t_{pipe} + \ldots + N \cdot t_{pipe} = t_{pre} + \frac{N \cdot (N+1)}{2} t_{pipe},$$

where the coefficient in front of each $t_{pipe}$ corresponds to the number of phases used to transfer data, IDL-by-IDL, from a corresponding latch to the cache circuit. This $T_{total,3}$ is less than the $T_{total,2}$ corresponding to the process of FIGS. 7A-7F and the $T_{total,1}$ for the alternative page buffer circuit in which the DBUS is not configurable (e.g., not formed by IDLs having connection transistors therebetween). For example, for N=12, the process of FIGS. 7A-7F consumes a time $T_{total,2}=78 \cdot (t_{pre}+t_{trans})$, while $T_{total,3}=t_{pre}+78 \cdot t_{pipe}$. If $t_{pre}=t_{trans}=t_{pipe}$, then $$T_{total,3} \approx \frac{1}{2} T_{total,2} \approx \frac{1}{4} T_{total,1}.$$

Accordingly, page buffer circuit operations, such as data reading, data transfer, data storage, and error correction, may be performed in less total time, improving memory device operation.

In some implementations, a pipelined process can be performed in which page buffers are divided into multiple groups, each group being treated as a unit for purposes of precharging and data transfer. For example, N page buffers can be grouped together into groups of i adjacent page buffers, for N/i total groups. Within each group, the i IDLs of the group are conductively connected to one another by control of connection transistors between the i IDLs of the group. To transfer data between two groups, connection transistors that couple adjacent IDLs of the two groups can be turned on.

In some implementations that incorporate grouped page buffers, each precharge operation/data transfer operation takes longer than if IDLs were precharged or transferred-to individually (e.g., as in FIGS. 9A-9G), because each group of IDLs has a larger capacitance than a single IDL. However, in some cases, the longer phase durations can be beneficial. The times $t_{pre}$ or $t_{trans}$ for a single IDL may be very short, e.g., shorter than a standard or feasible clock cycle of a memory device. Managing phases that are shorter than a clock cycle may introduce control difficulties. In some cases, the clock cycle may be sped up to match the short phases, but the higher clock speed may be associated with higher power consumption, which can be undesirable. In addition, when phases are short, dummy intervals may be necessary between phases to prevent overlapping or signal racing, which (i) again may introduce control challenges and (ii) reduces the speedup provided by the short phases. By grouping page buffers so that each phase is longer, the phase time can be made closer to or equal to a standard clock cycle of the memory device, simplifying device operation while retaining a speedup compared to some non-pipelined processes and/or processes that do not include a configurable DBUS. The page buffers can be grouped to achieve a balance between short phases (suggesting groups of fewer page buffers) and phases that are near a clock cycle and that are associated with no dummy intervals or short dummy intervals (suggesting groups of more page buffers).

Figure 10:
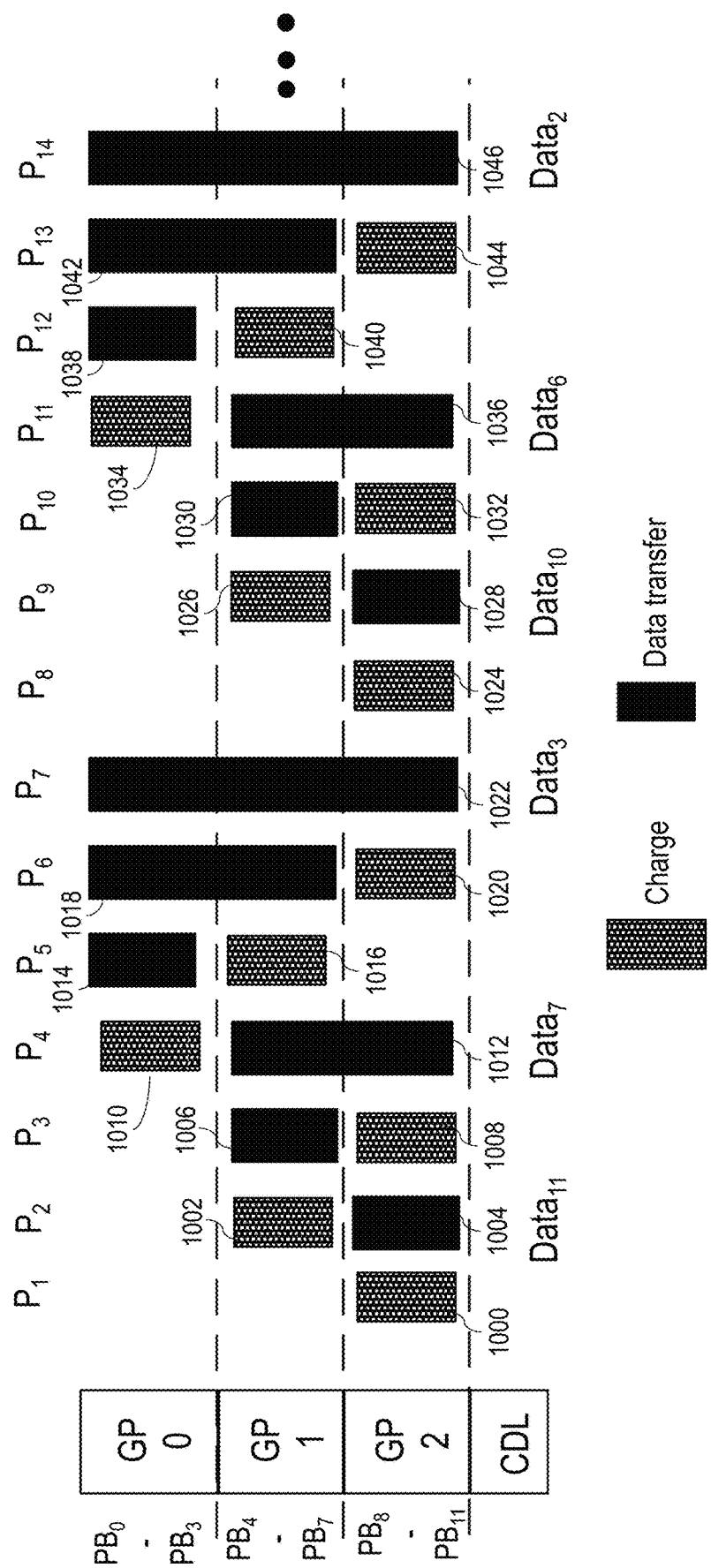
FIG. 10 shows a timing diagram illustrating operations of pipelined data transfer with grouped page buffers.

FIG. 10 illustrates phases of an example of a pipelined data transfer process including grouped page buffers, as facilitated by, for example, the configurable DBUSs (formed by IDLs of page buffers) described herein. The page buffers can have the characteristics described for page buffers 710 of the page buffer circuit 700 or the page buffer circuit 300. For example, the process of FIG. 10 can be performed using page buffer circuit 700 or page buffer circuit 300. In this example, N=12 page buffers are grouped into i=3 groups of four adjacent page buffers each ($PB_0$, . . . , $PB_3$; $PB_4$, . . . , $PB_7$; and $PB_8$, . . . , $PB_{11}$); however, other group numbers and numbers of page buffers within each group are also within the scope of this disclosure. The connection transistors coupled between IDLs of page buffers within each group are turned on so that the IDLs within each group are conductively connected. Group Two (GP2) is conductively closest to a cache circuit (CDL), followed by Group One (GP1), followed by Group Zero (GP0) conductively farthest from the cache circuit.

The process of FIG. 10 proceeds similarly to the process of FIGS. 9A-9G, except that data transfer and precharging operations are performed for the groups of IDLs rather than for individual IDLs. In the sequence of operations, data is transferred from respective first latches of each group to the cache circuit, and the sequence repeats to transfer data from respective second (third, etc.) latches of each group to the cache circuit, until data has been transferred from one latch of each page buffer to the cache circuit. Operations within each phase can be performed at least partially simultaneously.

As shown in FIG. 10, in a first phase P1, IDLs of GP2 are precharged (1000). For example, the IDLs are conductively connected to one another by controlling connection transistors, and one or more precharge transistors are turned on to couple the IDLs to a supply voltage, as described throughout this disclosure. The IDLs of GP2 are conductively separated from IDLs of GP1 by turning off a connection transistor between the IDL of $PB_7$ and the IDL of $PB_8$.

In a second phase P2, $Data_{11}$ is transferred from a latch of $PB_{11}$ (in GP2) to the cache circuit (1004), e.g., by controlling one or more transistors of $PB_{11}$ (e.g., a select transistor of the latch). $Data_{11}$ is transferred through a DBUS formed by the IDLs of GP2. IDLs of GP1 are precharged (1002).

In a third phase P3, $Data_7$ is transferred from a latch of $PB_7$ (in GP1) to the conductively-connected IDLs of GP1 (1006), e.g., by controlling one or more transistors of $PB_7$ (e.g., a select transistor of the latch). IDLs of GP2 are precharged (1008).

In a fourth phase P4, the IDLs of GP1 are conductively connected to the IDLs of GP2 by turning on the connection transistor between the IDL of $PB_7$ and the IDL of $PB_8$, forming a DBUS including the IDLs of groups GP1 and GP2. Accordingly, $Data_7$, from the latch of $PB_7$, is transferred from the IDLs of GP1 to the IDLs of GP2 and the cache circuit (1012). The conductively-connected IDLs of GP1 and GP2 form a DBUS. IDLs of GP0 are precharged (1010).

In a fifth phase P5, $Data_3$ is transferred from a latch of $PB_3$ (in GP0) to the IDLs of GP0 (1014). IDLs of GP1 are precharged (1016).

In a sixth phase P6, a connection transistor between $PB_3$ and $PB_4$ is turned on to conductively connect the IDLs of GP0 to the IDLs of GP1, transferring $Data_3$ from the IDLs of GP0 to the IDLs of GP1 (1018). IDLs of GP2 are precharged (1020).

In a seventh phase P7, a connection transistor between $PB_7$ and $PB_8$ is turned on to conductively connect the IDLs of GP0 and GP1 to the IDLs of GP2, transferring $Data_3$, from the latch of $PB_3$, to the IDLs of GP2 and the cache circuit (1022). The conductively-connected IDLs of GP0, GP1, and GP2 form a DBUS.

Phases P1-P7 constitute a first sub-cycle in which data has been transferred from one page buffer of each of groups GP0, GP1, and GP2. The process can continue with subsequent sub-cycles, e.g., to transfer data from remaining page buffers to the cache circuit. In the example of FIG. 10, data is transferred from latches of three page buffers in each sub-cycle (corresponding to the i=3 groups GP0, GP1, and GP2), and the overall process includes four sub-cycles (corresponding to the four page buffers in each group).

Phases P8-P14 constitute a second sub-cycle. In an eighth phase P8, the IDLs of GP2 are precharged (1024). In a ninth phase P9, $Data_{10}$ is transferred from a latch of $PB_{10}$ (in GP2) to the cache circuit (1028), e.g., by controlling one or more transistors of $PB_{10}$ (e.g., a select transistor of the latch). $Data_{10}$ is transferred through a DBUS formed by the IDLs of GP2. IDLs of GP1 are precharged (1026).

In a tenth phase P10, $Data_6$ is transferred from a latch of $PB_6$ (in GP1) to the conductively-connected IDLs of GP1 (1030), e.g., by controlling one or more transistors of PB6 (e.g., a select transistor of the latch). IDLs of GP2 are precharged (1032).

In an eleventh phase P11, the IDLs of GP1 are conductively connected to the IDLs of GP2 by turning on the connection transistor between the IDL of $PB_7$ and the IDL of $PB_8$, forming a DBUS including the IDLs of groups GP1 and GP2. Accordingly, $Data_6$, from the latch of $PB_6$, is transferred from the IDLs of GP1 to the IDLs of GP2 and to the cache circuit (1036). The conductively-connected IDLs of GP1 and GP2 form a DBUS. IDLs of GP0 are precharged (1034).

In a twelfth phase P12, $Data_2$ is transferred from a latch of $PB_2$ (in GP0) to the IDLs of GP0 (1038). IDLs of GP1 are precharged (1040).

In a thirteenth phase P13, a connection transistor between $PB_3$ and $PB_4$ is turned on to conductively connect the IDLs of GP0 to the IDLs of GP1, transferring $Data_2$ from the IDLs of GP0 to the IDLs of GP1 (1042). IDLs of GP2 are precharged (1044).

In a fourteenth phase P14, the connection transistor between $PB_7$ and $PB_8$ is turned on to conductively connect the IDLs of GP0 and GP1 to the IDLs of GP2, transferring $Data_2$, from the latch of $PB_2$, to the IDLs of GP2 and the cache circuit (1046). The conductively-connected IDLs of GP0, GP1, and GP2 form a DBUS.

The data transfer processes described with respect to FIGS. 6A-6C, FIGS. 7A-7F, FIGS. 9A-9H, and FIG. 10 are examples; other implementations are also within the scope of this disclosure. For example, in some implementations, control operations and process flow may differ from the examples provided herein. For example, although FIGS. 9G-9H illustrate that DBUS 950C includes IDLs 714-n-2, 714-n-1, and 714-n during data transfer to cache circuit 712, in some implementations, connection transistor 718-n-2 can be closed during data transfer of the data from latch 720-n-2 to cache circuit 712, because the data has already been loaded onto IDL 714-n-1, such that a conductive connection to IDL 714-n-2 may not be necessary for that portion of the process.

Moreover, examples described throughout this disclosure relate to NMOS page buffer circuits in which data is transferred based on (i) precharging (e.g., a metal strip) to a precharged voltage followed by (ii) discharging ("pulling down") to indicate/transfer a first data value, or remaining at the precharged voltage to indicate/transfer a second data value. Data can be transferred to one or more IDLs (received by the one or more IDLs) by connecting the one or more IDLs to another element that results in the one or more IDLs discharging or remaining at the precharged voltage. However, in some implementations (e.g., using PMOS devices or a mixture of NMOS and PMOS devices) another data transfer method can be used, such as pulling up a voltage to indicate a data value, in which case precharging may not be performed and/or in which case the data transfer operation may differ from those described in examples herein. The page buffer circuits and processes described herein, e.g., including IDLs of page buffers couplable to one another in various combinations to form a DBUS, can be applied to those and other data transfer operations.

"First," "second," and other numerical labels used herein (such as "first phase of operations" and "first IDLs") do not indicate any particular temporal or spatial ordering, absent other disclosure or recitation indicating such an ordering.

The disclosed and other examples (e.g., operations to control transistor(s) of memory devices) can be implemented as one or more computer program products, for example, one or more modules of computer program instructions encoded on a computer readable medium for execution by, or to control the operation of, a data processing apparatus (e.g., control logic of a memory device). The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers (such as control logic of a memory device or processing component(s) of a controller). The apparatus can include, in addition to hardware, code that creates an execution environment for the computer program in question, e.g., code that constitutes processor firmware, a protocol stack, a database management system, an operating system, or a combination of one or more of them.

A system may encompass all apparatuses, devices, and machines for processing data, including, by way of example, a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory device, comprising:
   a memory cell array comprising memory cells;
   a page buffer circuit comprising a plurality of page buffers coupled to the memory cell array, each page buffer comprising a plurality of latches and an internal data line (IDL) arranged to couple to the plurality of latches; and
   a cache circuit comprising a plurality of caches,
   wherein the IDLs of the plurality of page buffers are configured to be conductively connected together in series to form a data bus (DBUS) that conductively connects the page buffer circuit to the cache circuit for data transfer.

2. The memory device of claim 1, comprising a plurality of connection transistors between adjacent IDLs in the plurality of page buffers, wherein each connection transistor of the plurality of connection transistors is configured to:
   be turned on to conductively connect a pair of adjacent IDLs corresponding to the connection transistor, and
   be turned off to conductively separate the pair of adjacent IDLs corresponding to the connection transistor.

3. The memory device of claim 2, comprising a control circuitry configured to:
   turn off at least one of the plurality of connection transistors to conductively separate a first IDL of a first page buffer of the plurality of page buffers from other IDLs of other page buffers of the plurality of page buffers; and
   while the first IDL is conductively separated from the other IDLs, control at least one transistor in the first page buffer to sense data from the memory cell array and to transfer the sensed data through the first IDL to a latch of the first page buffer for storing the sensed data.

4. The memory device of claim 2, comprising a control circuitry configured to:
turn off at least one of the plurality of connection transistors to conductively separate a first IDL of a first page buffer of the plurality of page buffers from other IDLs of other page buffers of the plurality of page buffers; and
while the first IDL is conductively separate from the other IDLs, control at least one transistor in the first page buffer to cause data stored in a first latch of the first page buffer to be transferred through the first IDL to a second latch of the first page buffer.

5. The memory device of claim 2, comprising a control circuitry configured to:
turn on at least one of the plurality of connection transistors to form a first DBUS coupled to the cache circuit, the first DBUS including a first IDL of a first page buffer of the plurality of page buffers; and
control at least one transistor in the first page buffer to cause data stored in a latch of the first page buffer to be transferred through the first DBUS to the cache circuit.

6. The memory device of claim 5, wherein the control circuitry is configured to, while forming the first DBUS, turn off a second connection transistor of the plurality of connection transistors to conductively separate the first IDL from a second IDL that is adjacent to the first IDL.

7. The memory device of claim 5, wherein the first DBUS includes the first IDL and at least one other IDL of at least one other page buffer of the plurality of page buffers, the at least one other IDL being arranged conductively between the first IDL and the cache circuit, and
wherein the data stored in the latch of the first page buffer is transferred through the first IDL and through the at least one other IDL to the cache circuit.

8. The memory device of claim 5, wherein the control circuitry is configured to:
turn on a precharge transistor of the first page buffer to conductively connect the first DBUS to a supply voltage for precharging the first DBUS;
turn off the precharge transistor; and
subsequent to turning off the precharge transistor, turn on a select transistor of the first page buffer to conductively connect the latch to the first IDL.

9. The memory device of claim 2, comprising a control circuitry configured to sequentially transfer data from each page buffer to the cache circuit, comprising, for each page buffer:
controlling the plurality of connection transistors to form a corresponding DBUS such that the corresponding DBUS begins with the IDL of the page buffer and extends to conductively connect the page buffer to the cache circuit; and
controlling one or more transistors of the page buffer to transfer data from a latch of the page buffer to the cache circuit through the corresponding DBUS.

10. The memory device of claim 2, comprising a control circuitry configured to, during a first phase of operation:
control the plurality of connection transistors to apportion the IDLs of the plurality of page buffers into
one or more first IDLs forming a first group, corresponding to one or more first page buffers, that are conductively connected to one another, and
one or more second IDLs forming a second group, corresponding to one or more second page buffers, that are conductively connected to one another and conductively separate from the one or more first IDLs of the second group;
conductively connect the one or more first IDLs to a supply voltage to precharge the one or more first IDLs; and
control one or more transistors of the one or more second page buffers to transfer data from a latch of the one or more second page buffers to the one or more second IDLs.

11. The memory device of claim 10, wherein the one or more second IDLs are conductively connected to the cache circuit, such that the one or more second IDLs form a first DBUS, the first DBUS coupling the one or more second page buffers to the cache circuit, and
wherein, during the first phase of operation, the data from the latch of the one or more second page buffers is transferred to the cache circuit through the first DBUS.

12. The memory device of claim 10, wherein the control circuitry is configured to, during a second phase of operation subsequent to the first phase of operation:
control one or more transistors of the one or more first page buffers to transfer data from a latch of the one or more first page buffers to the one or more first IDLs; and
conductively connect the one or more second IDLs to the supply voltage to precharge the one or more second IDLs.

13. The memory device of claim 12, wherein the control circuitry is configured to, during a third phase of operation subsequent to the second phase of operation:
control the plurality of connection transistors to conductively connect the one or more first IDLs to the one or more second IDLs, such that the data from the latch of the one or more first page buffers is transferred from the one or more first IDLs to the one or more second IDLs and the cache circuit.

14. The memory device of claim 13, wherein the control circuitry is configured to:
control the plurality of connection transistors to apportion the IDLs of the plurality of page buffers into one or more third IDLs forming a third group, corresponding to one or more third page buffers, that are conductively connected to one another, wherein the one or more third IDLs are adjacent to the one or more first IDLs; and
wherein the control circuitry is further configured to, during a fourth phase of operation subsequent to the third phase of operation:
conductively connect the one or more first IDLs to the supply voltage to precharge the one or more first IDLs; and
control one or more transistors of the one or more third page buffers to transfer data from a latch of the one or more third page buffers to the one or more third IDLs.

15. The memory device of claim 14, wherein the control circuitry is configured to, during a fifth phase of operation subsequent to the fourth phase of operation:
control the plurality of connection transistors to conductively connect the one or more first IDLs to the one or more third IDLs, such that the data from the latch of the one or more third page buffers is transferred from the one or more third IDLs to the one or more first IDLs; and conductively connect the one or more second IDLs to the supply voltage to precharge the one or more second IDLs.

16. The memory device of claim 15, wherein the control circuitry is configured to, during a sixth phase of operation subsequent to the fifth phase of operation:
control the plurality of connection transistors to conductively connect the one or more second IDLs to the one or more first IDLs, such that the data from the latch of the one or more third page buffers is transferred from the one or more first IDLs to the one or more second IDLs and the cache circuit.

17. The memory device of claim 1, wherein the IDLs of the plurality of page buffers are arranged in a single metal channel of the memory device.

18. A page buffer circuit, comprising:
a plurality of page buffers, each page buffer comprising a plurality of latches and an internal data line (IDL) arranged to couple to the plurality of latches, wherein the IDLs of the plurality of page buffers are configured to be conductively connected together in series to form a data bus (DBUS) for data transfer.

19. The page buffer circuit of claim 18, comprising:
a plurality of connection transistors between adjacent IDLs in the plurality of page buffers, wherein each connection transistor of the plurality of connection transistors is configured to:
be turned on to conductively connect a pair of adjacent IDLs corresponding to the connection transistor, and
be turned off to conductively separate the pair of adjacent IDLs corresponding to the connection transistor.

20. The page buffer circuit of claim 18, wherein the IDLs of the plurality of page buffers are arranged in series with one another in a single metal channel of a memory device.

* * * * *